US008753929B2

(12) United States Patent
Anderson et al.

(10) Patent No.: US 8,753,929 B2
(45) Date of Patent: Jun. 17, 2014

(54) STRUCTURE FABRICATION METHOD

(71) Applicant: International Business Machines Corporation, Armonk, NY (US)

(72) Inventors: Brent A. Anderson, Jericho, VT (US); Victor W. C. Chan, Newburgh, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/866,162

(22) Filed: Apr. 19, 2013

(65) Prior Publication Data

US 2013/0230960 A1 Sep. 5, 2013

Related U.S. Application Data

(60) Continuation of application No. 12/189,298, filed on Aug. 11, 2008, now Pat. No. 8,466,503, which is a division of application No. 11/275,514, filed on Jan. 11, 2006, now Pat. No. 7,473,593.

(51) Int. Cl.
*H01L 21/336* (2006.01)

(52) U.S. Cl.
USPC ............................ 438/197; 438/299; 438/301

(58) Field of Classification Search
USPC ......................................... 438/197, 299, 301
See application file for complete search history.

(56) References Cited

U.S. PATENT DOCUMENTS

| 4,998,150 A | 3/1991 | Rodder et al. |
| 6,576,945 B2 | 6/2003 | Mandelman et al. |
| 6,777,760 B1 | 8/2004 | Jan et al. |
| 6,867,443 B2 | 3/2005 | Liu et al. |
| 2004/0043549 A1* | 3/2004 | Sayama et al. ............... 438/197 |

(Continued)

FOREIGN PATENT DOCUMENTS

| JP | 53145485 A | 12/1978 |
| WO | WO2004059727 A1 | 7/2004 |

OTHER PUBLICATIONS

Leonard Rubin and John Poate; Ion Implatation in Silicon Technology; Jun./Jul. 2003, American Institute of Physics, pp. 12-15.

(Continued)

*Primary Examiner* — Jae Lee
(74) *Attorney, Agent, or Firm* — Schmeiser, Olsen & Watts, LLP; Michael J. Le Strange

(57) ABSTRACT

A structure fabrication method. A provided structure includes a gate dielectric region on the substrate and a gate electrode region on the gate dielectric region. Atoms are implanted in a top portion of the gate electrode region, which expands the top portion of the gate electrode in a direction parallel to a top surface of the gate dielectric region. After the atom implantation, a conformal dielectric layer is formed on top and side walls of the gate electrode region. A dielectric spacer layer, formed on the conformal dielectric layer, is etched such that only spacer portions of the dielectric spacer layer which are under the conformal dielectric layer remain, wherein for any point of the remaining spacer portions, a straight line through that point and parallel to a reference direction intersects the conformal dielectric layer. The reference direction is perpendicular to the top surface of the gate dielectric region.

14 Claims, 23 Drawing Sheets

(56) References Cited

U.S. PATENT DOCUMENTS

| | | |
|---|---|---|
| 2004/0119490 A1 | 6/2004 | Liu et al. |
| 2004/0142524 A1 | 7/2004 | Grupp et al. |
| 2004/0222498 A1 | 11/2004 | Beintner et al. |
| 2005/0059214 A1 | 3/2005 | Cheng et al. |
| 2005/0067659 A1 | 3/2005 | Gutsche et al. |
| 2005/0282325 A1 | 12/2005 | Belyansky et al. |

OTHER PUBLICATIONS

Notice of Allowance (Mail Date Jul. 29, 2008) for U.S. Appl. No. 11/275,514, filed Jan. 11, 2006; Art Unit 2895; Confirmation No. 1723.

* cited by examiner

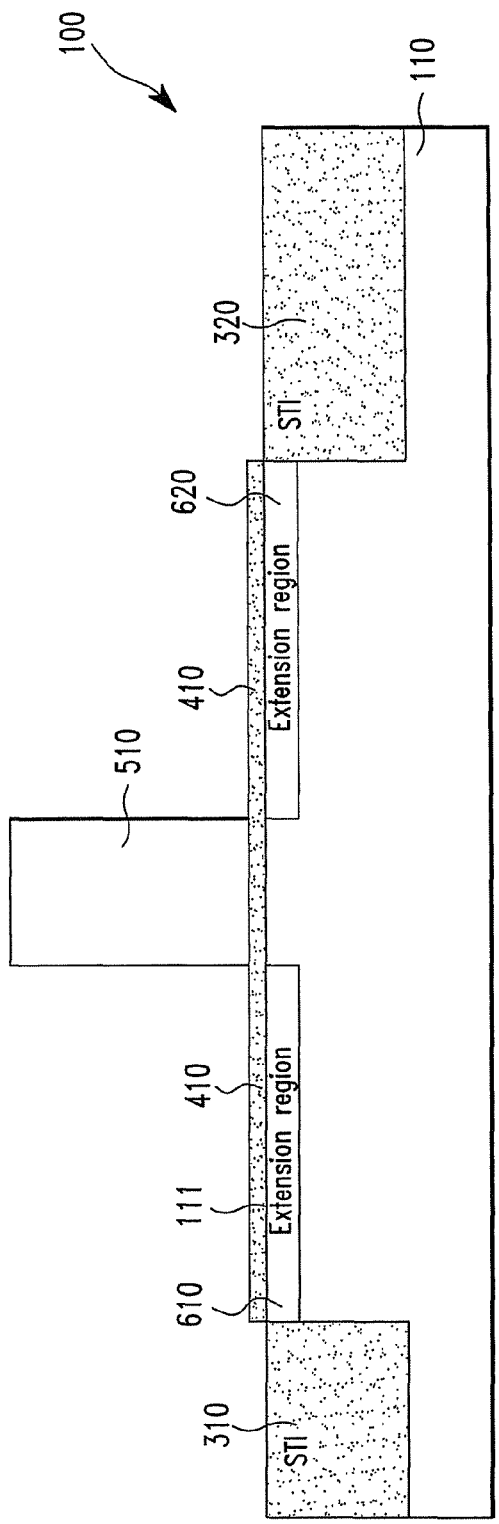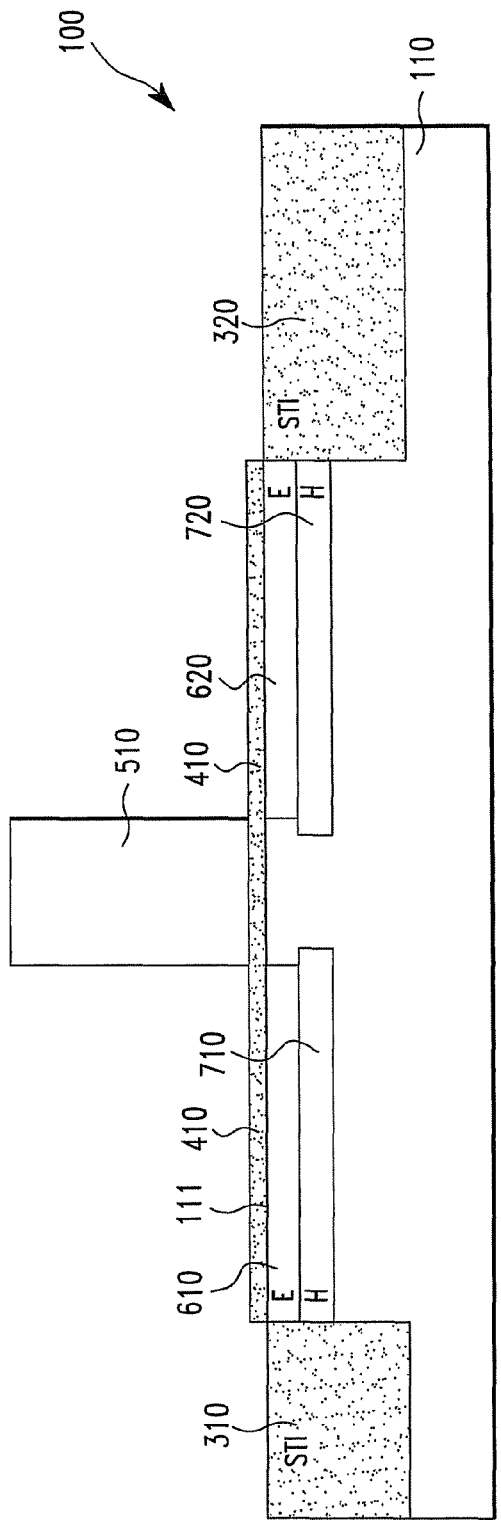

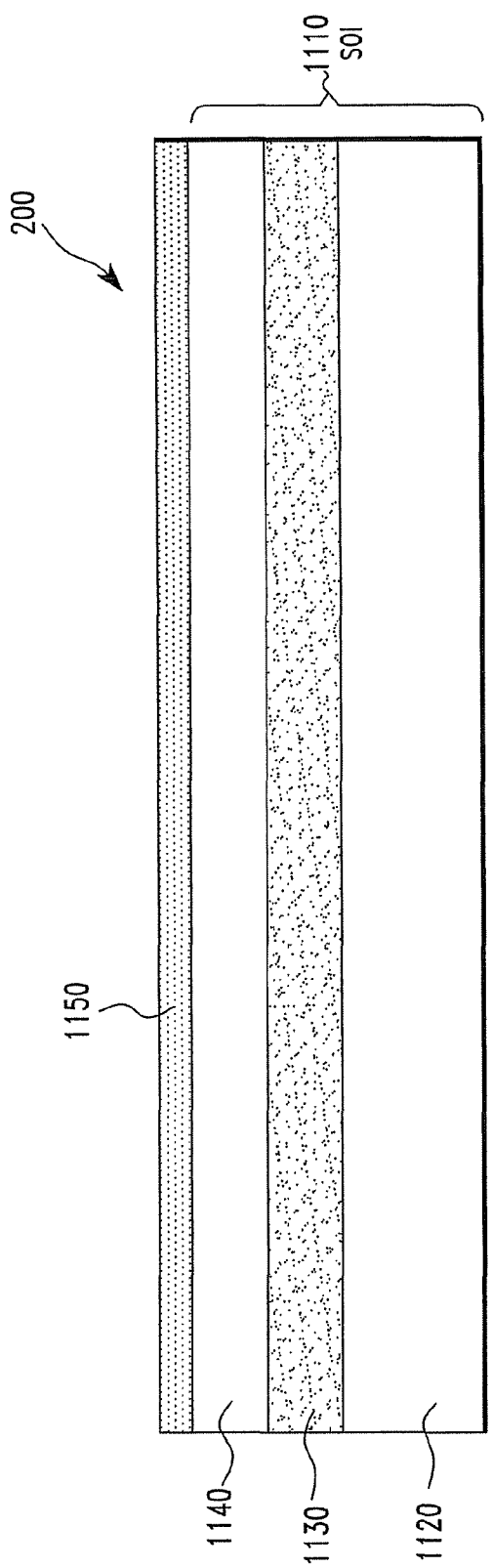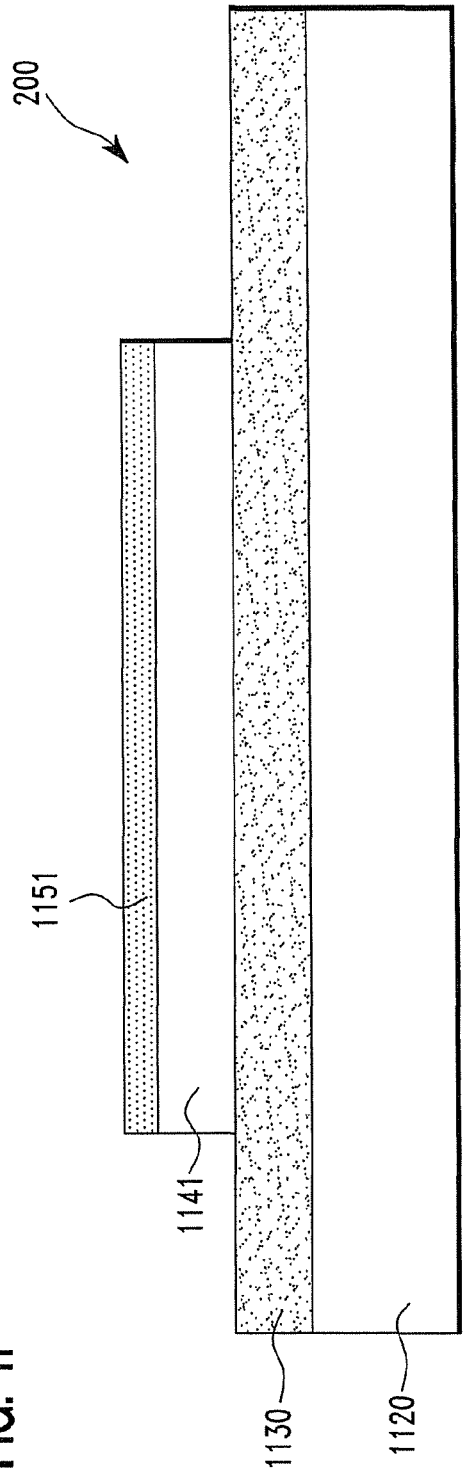

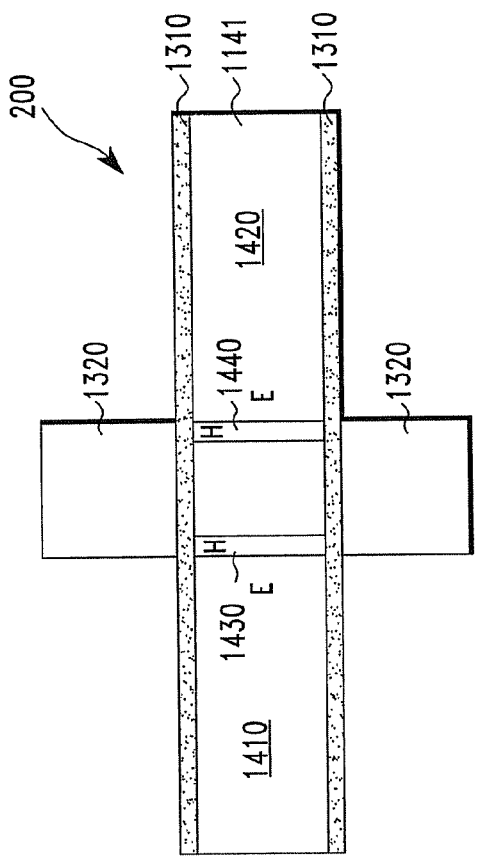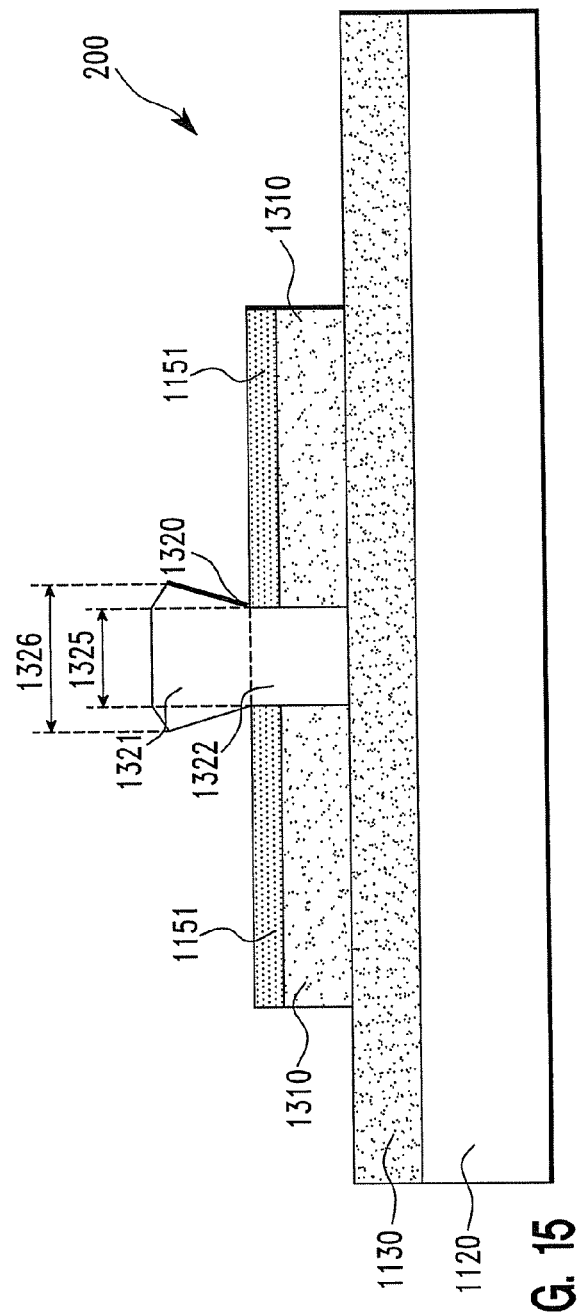

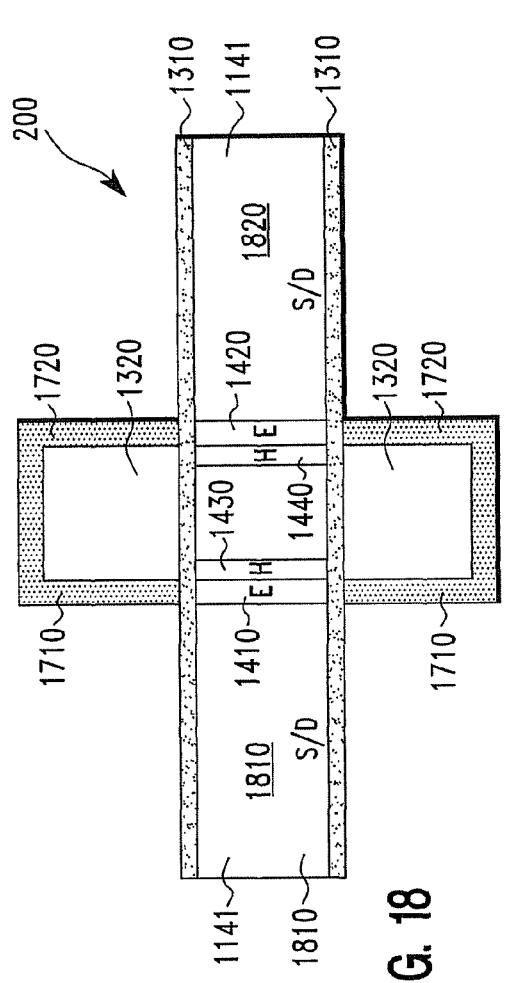
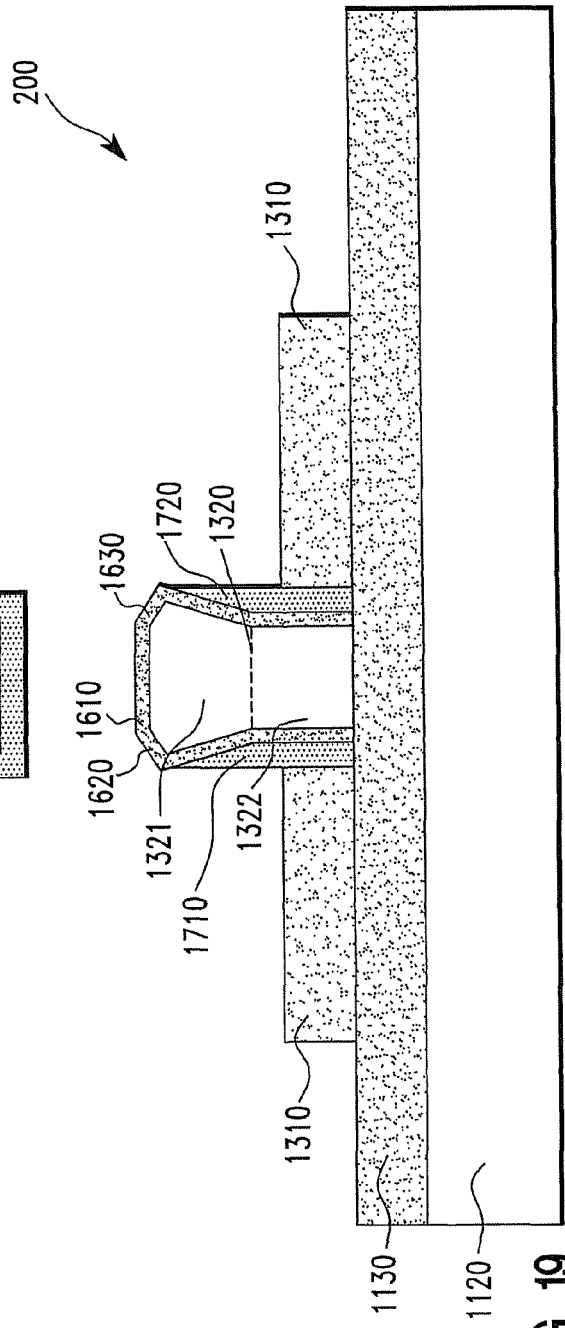
FIG. 18
FIG. 19

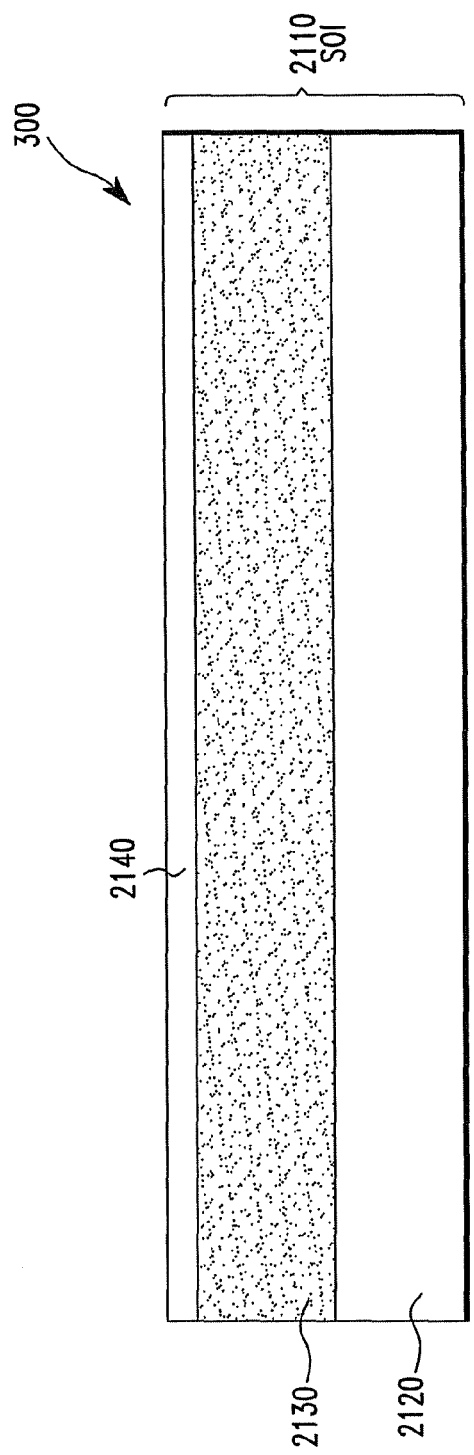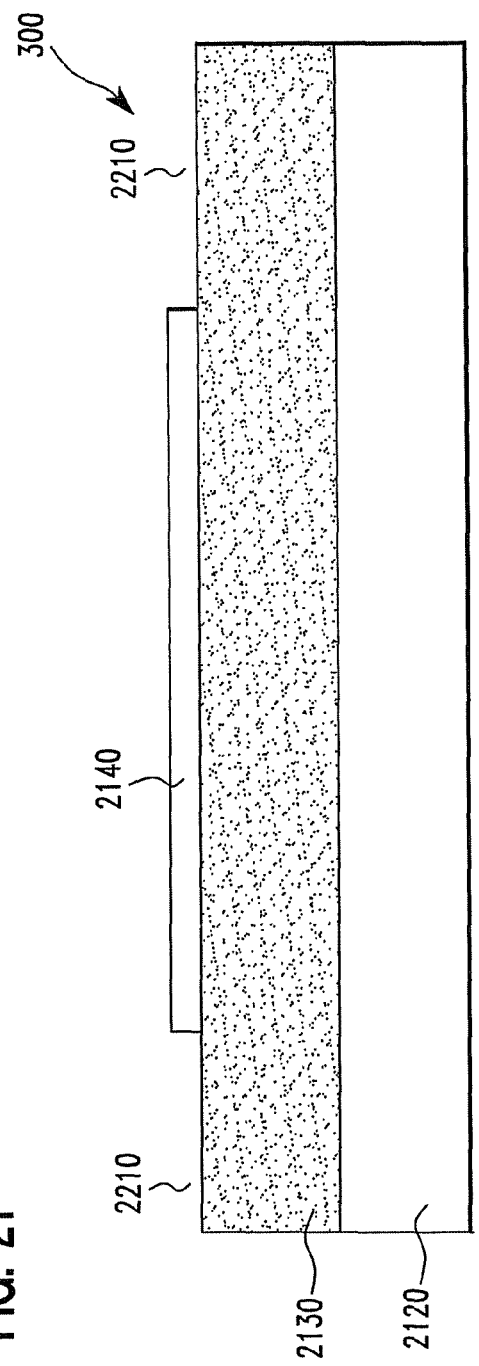

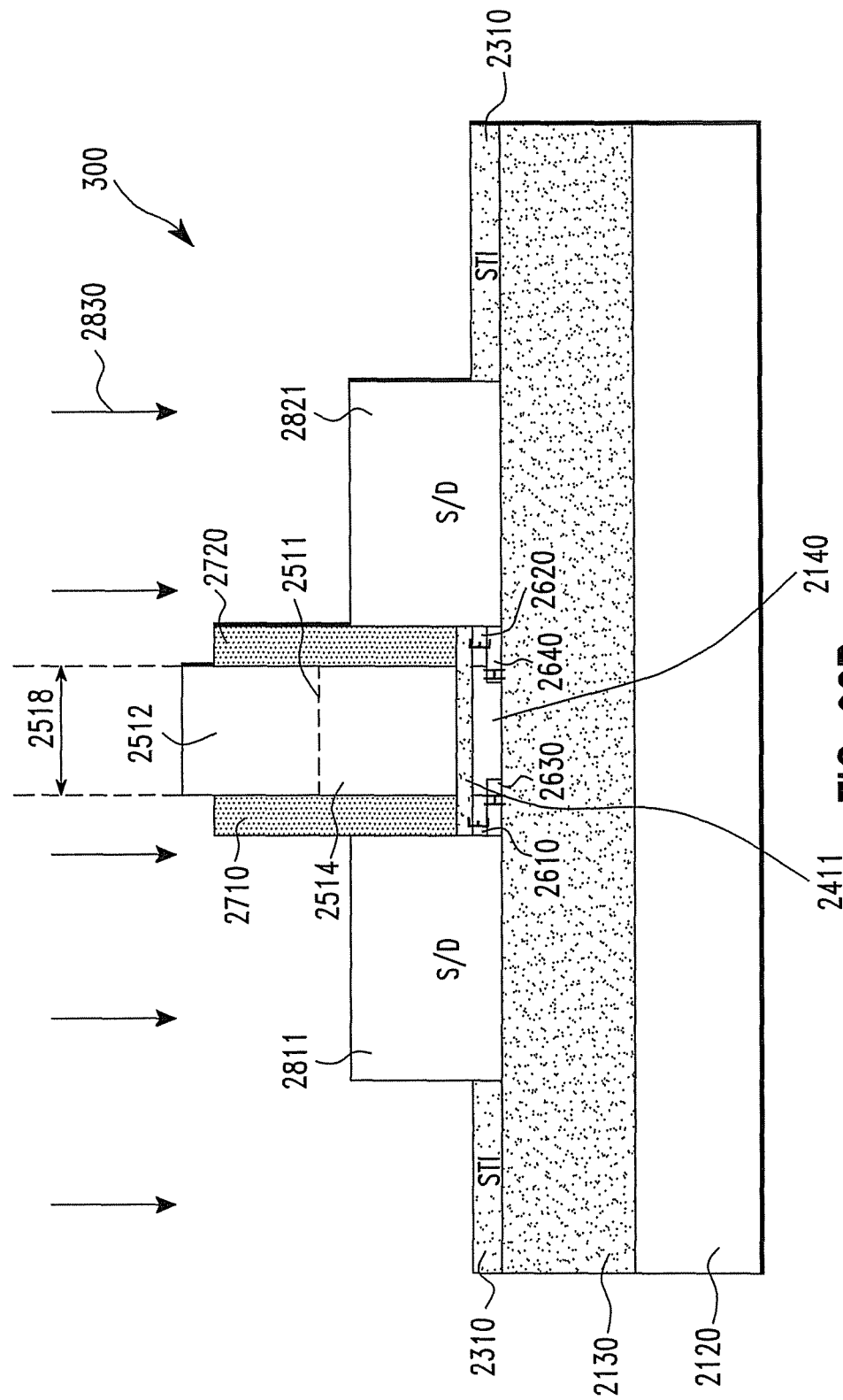

US 8,753,929 B2

STRUCTURE FABRICATION METHOD

This application is a continuation application claiming priority to Ser. No. 12/189,298, filed Aug. 11, 2008, which is a divisional application of Ser. No. 11/275,514, filed Jan. 11, 2006, U.S. Pat. No. 7,473,593, issued Jan. 6, 2009.

BACKGROUND OF THE INVENTION

1. Technical Field

The present invention relates to semiconductor transistors, and more particularly, to semiconductor transistors with expanded top portions of gates.

2. Related Art

In the fabrication process of a typical semiconductor device, if a gate is small it is very difficult to form silicide in the top portion of the gate. Therefore, there is a need for a semiconductor transistor with an expanded top portion of a gate (and a method for forming the same).

SUMMARY OF THE INVENTION

The present invention provides a semiconductor structure, comprising (a) a semiconductor region including a channel region, a first source/drain region, and a second source/drain region, wherein the channel region is disposed between the first source/drain region and the second source/drain region; (b) a gate dielectric region in direct physical contact with the channel region; and (c) a gate electrode region including a top portion and a bottom portion, wherein the bottom portion is in direct physical contact with the gate dielectric region, wherein a first width of the top portion is greater than a second width of the bottom portion, wherein the gate electrode region is electrically insulated from the channel region by the gate dielectric region, and wherein a first upper portion and a second upper portion of the first and second source/drain regions, respectively, are compressively strained.

The present invention provides a semiconductor structure, comprising (a) a semiconductor region including a channel region, a first source/drain region, and a second source/drain region, wherein the channel region is disposed between the first source/drain region and the second source/drain region; (b) a gate dielectric region in direct physical contact with the channel region; (c) a gate electrode region including a top portion and a bottom portion, wherein the bottom portion is in direct physical contact with the gate dielectric region, wherein a first width of the top portion is greater than a second width of the bottom portion, and wherein the gate electrode region is electrically insulated from the channel region by the gate dielectric region; and (d) an ion beam incident on the gate electrode region, wherein the ion beam comprises ions of a material selected from the group consisting of germanium and arsenic.

The present invention provides a semiconductor transistor with an expanded top portion of a gate or an expanded top portion of a source or drain.

BRIEF DESCRIPTION OF THE DRAWINGS

FIGS. 1-10 show a first fabrication process of a semiconductor transistor with an expanded top portion of a gate, in accordance with embodiments of the present invention.

FIGS. 11-20 show a second fabrication process of a vertical semiconductor transistor with an expanded top portion of a gate, in accordance with embodiments of the present invention.

FIGS. 21-30 show a third fabrication of another semiconductor transistor with an expanded top portion of a gate, in accordance with embodiments of the present invention.

DETAILED DESCRIPTION OF THE INVENTION

FIGS. 1-10 show a first fabrication process for forming a transistor structure 100, in accordance with embodiments of the present invention, wherein FIGS. 1-10 show cross-section views of the transistor structure 100.

Figure 1:
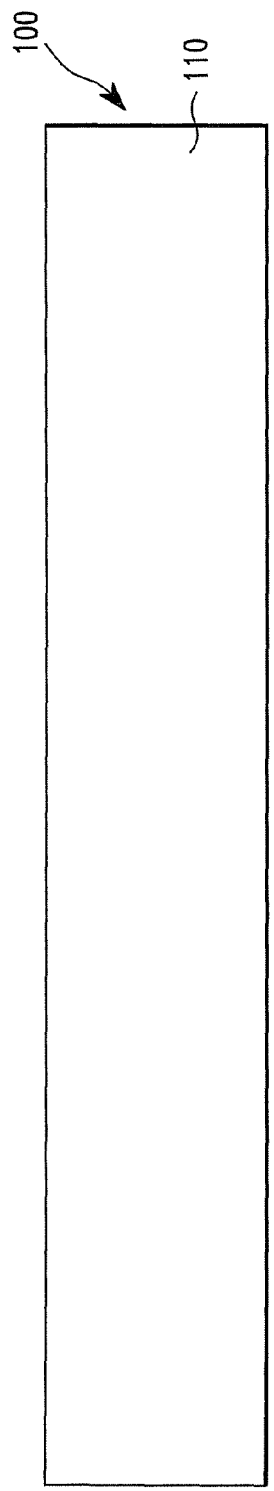

More specifically, with reference to FIG. 1, in one embodiment, the first fabrication process starts out with a silicon substrate 110.

Figure 2:
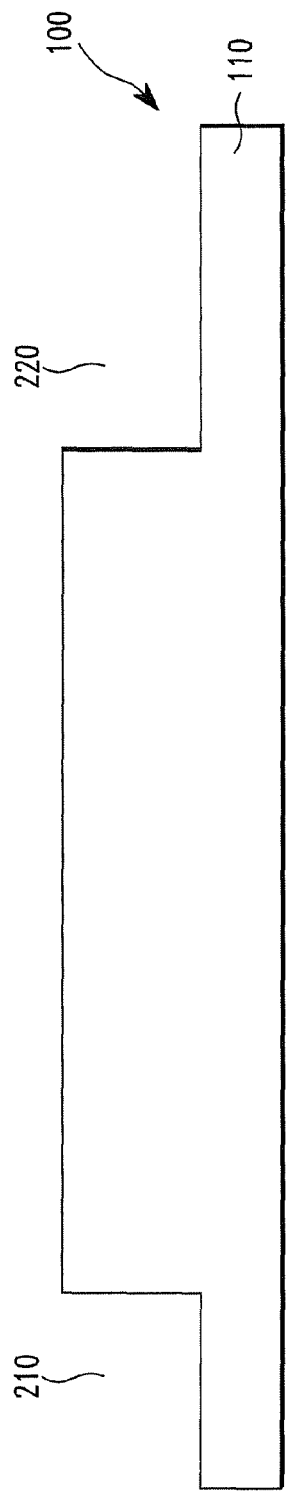

Next, with reference to FIG. 2, in one embodiment, two trenches 210 and 220 are formed in the silicon substrate 110. Illustratively, the trenches 210 and 220 are formed using a conventional lithographic and etching process.

Figure 3:
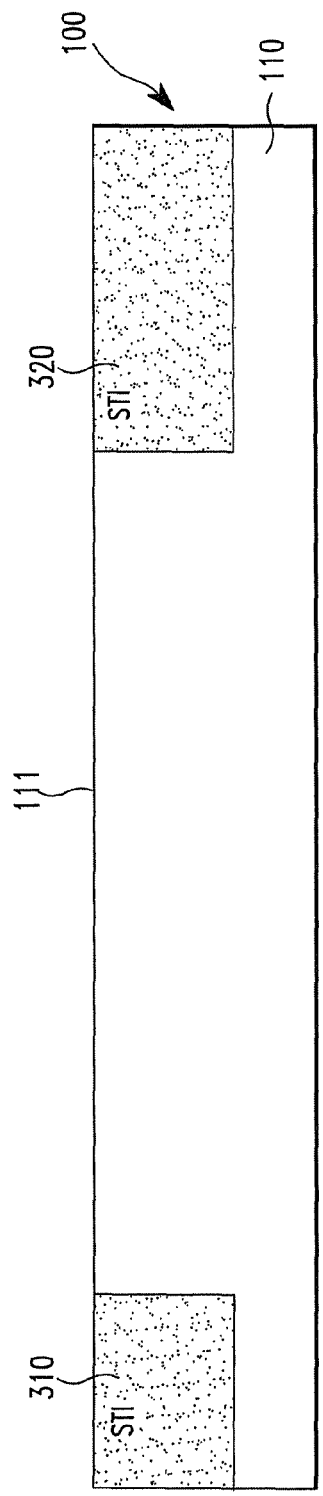

Next, with reference to FIG. 3, in one embodiment, two STI (Shallow Trench Isolation) regions 310 and 320 are formed in the two trenches 210 and 220 (FIG. 2), respectively, using a conventional method. Illustratively, the two STI regions 310 and 320 comprise silicon dioxide.

Figure 4:
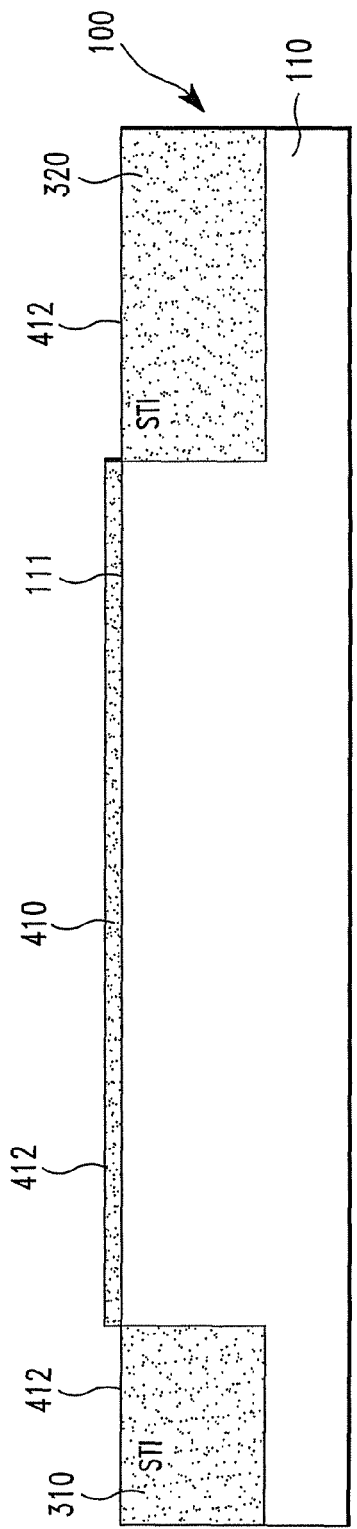

Next, with reference to FIG. 4, in one embodiment, a gate dielectric layer 410 is formed on a top surface 111 of the silicon substrate 110. Illustratively, the gate dielectric layer 410 comprises silicon dioxide. In one embodiment, the gate dielectric layer 410 is formed by thermal oxidation.

Figure 5:
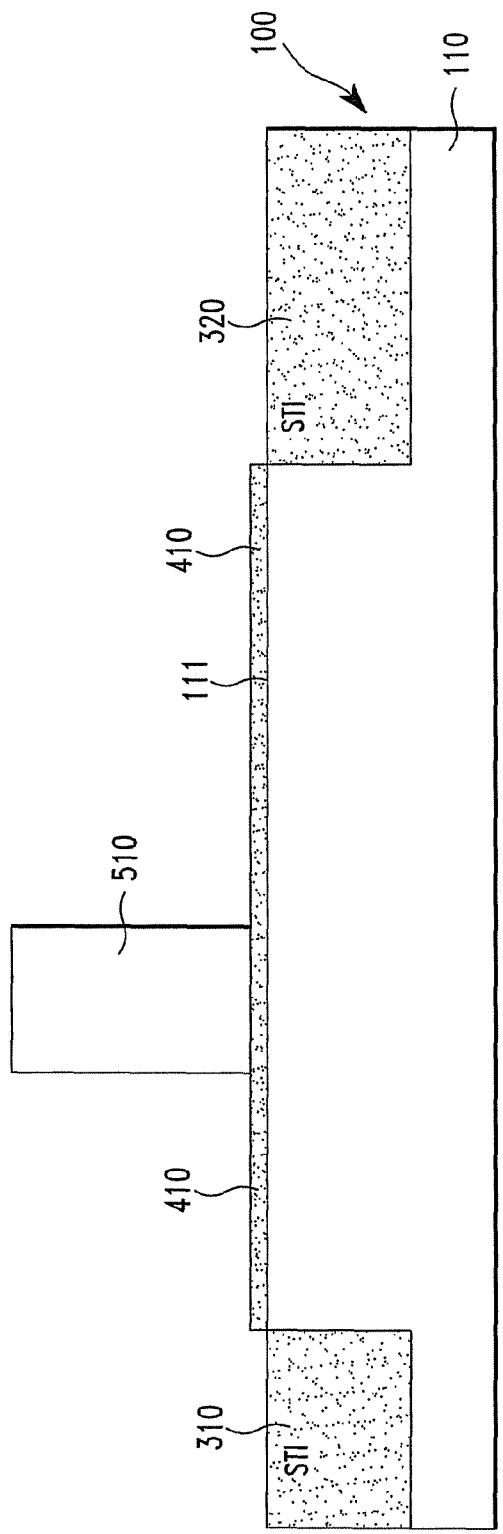

Next, with reference to FIG. 5, in one embodiment, a gate electrode region 510 is formed on the top surface 111 of the silicon substrate 110. In one embodiment, the gate electrode region 510 is formed by (i) CVD (Chemical Vapor Deposition) of polysilicon everywhere on a top surface 412 of the structure 100 (FIG. 4) to form a polysilicon layer (not shown), and then (ii) a conventional lithographic and etching process to etch the deposited polysilicon layer, resulting in the gate electrode region 510, as shown in FIG. 5.

Next, with reference to FIG. 6, in one embodiment, extension regions 610 and 620 are formed in the silicon substrate 110. Illustratively, the extension regions 610 and 620 are formed by ion implantation using the gate electrode region 510 as a blocking mask.

Next, with reference to FIG. 7, in one embodiment, halo regions 710 and 720 are formed in the silicon substrate 110. Illustratively, the halo regions 710 and 720 are formed by ion implantation using the gate electrode region 510 as a blocking mask.

Figure 8:
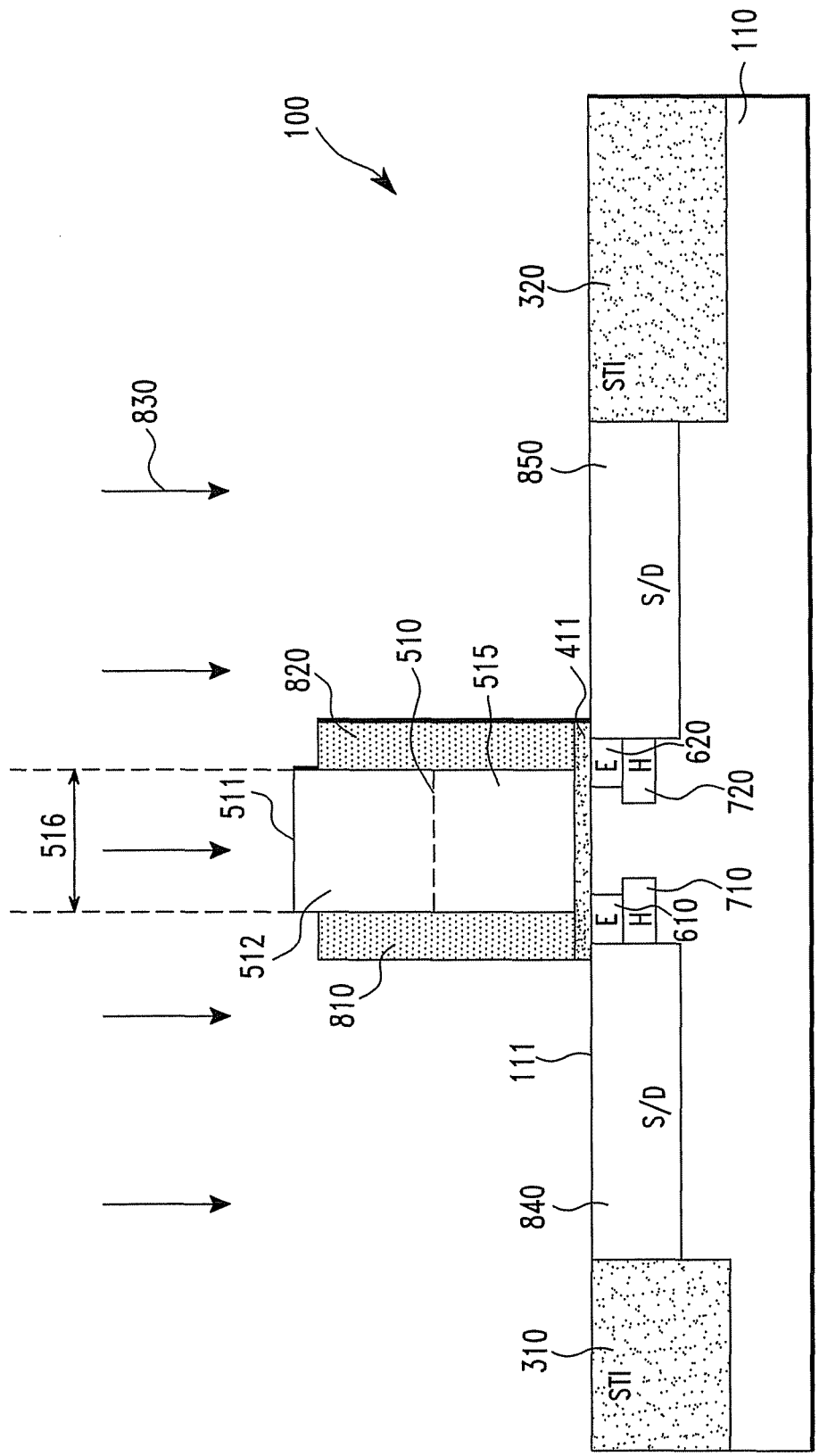

Next, with reference to FIG. 8, in one embodiment, dielectric spacers 810 and 820 are formed on side walls of the gate electrode region 510. Illustratively, the dielectric spacers 810 and 820 are formed by (i) CVD of an insulating material, such as silicon dioxide or silicon nitride, or a composite, everywhere on top of the structure 100 of FIG. 7, and then (ii) directional etching back until the top surface 111 of the silicon substrate 110 and a top surface 511 of the gate electrode region 510 are exposed to the surrounding ambient.

Next, in one embodiment, source/drain regions 840 and 850 are formed in the silicon substrate 110. Illustratively, the source/drain regions 840 and 850 are formed by ion implantation using the gate electrode region 510 and the dielectric spacers 810 and 820 as a blocking mask.

Next, in one embodiment, germanium atoms are implanted in a top portion 512 of the gate electrode region 510 by ion implantation in a direction indicated by arrows 830. Hereafter, the implantation of germanium atoms in the top portion 512 of the gate electrode region 510 of FIG. 8 can be referred to as a germanium implantation step 830. Illustratively, the germanium implantation step 830 uses germanium atoms at a high dose ($10^{16}$ Ge atoms/cm$^2$) and at a low energy. The directions 830 can be vertical or tilted less than 10 degrees from vertical. As a result of the germanium implantation step 830, the top portion 512 expands laterally, as shown in FIG. 9A.

Figure 9A:
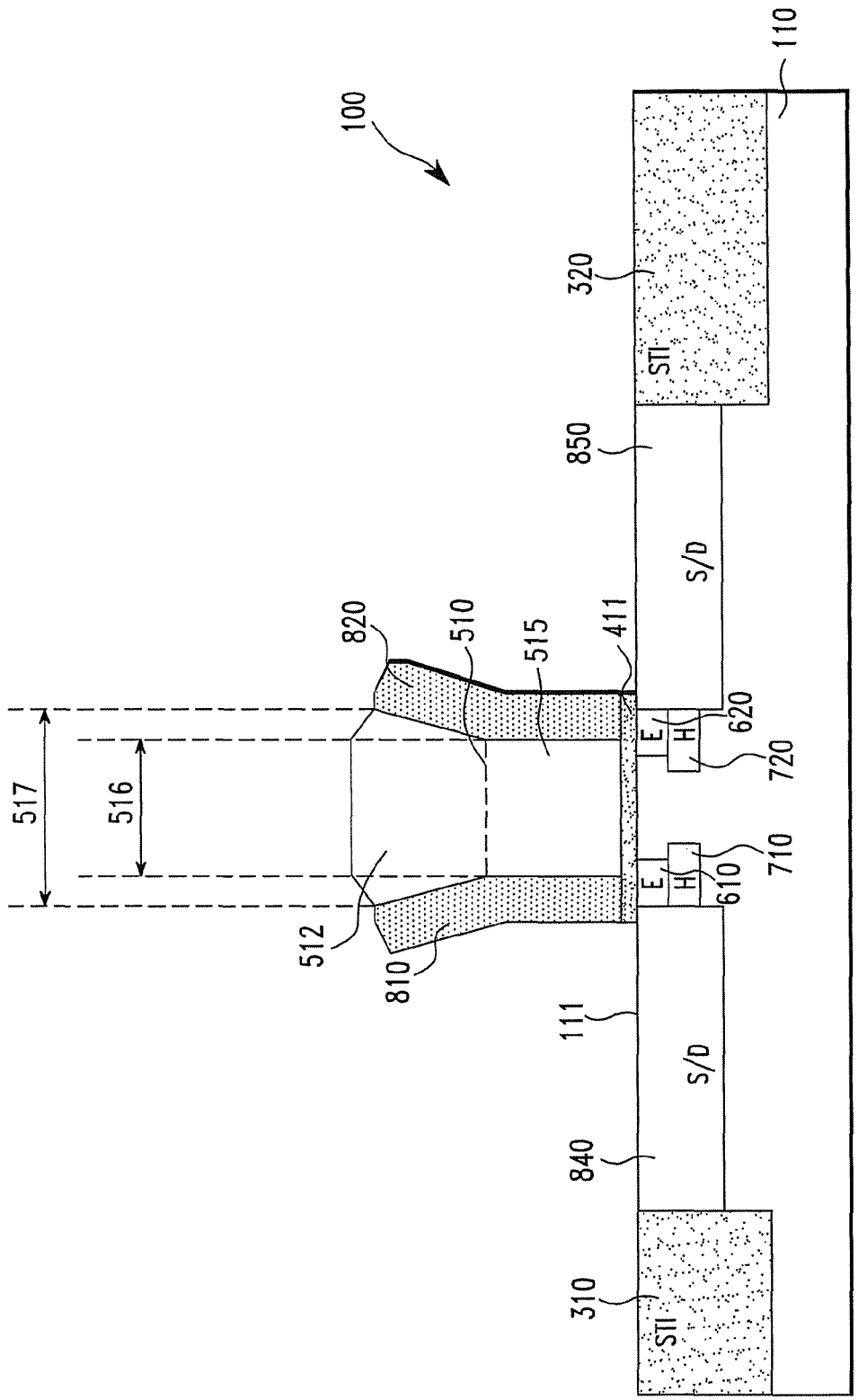

With reference to FIG. 9A, it can be seen that as a result of the lateral expansion of the top portion 512, a width 517 of the top portion 512 is greater than a width 516 of the bottom portion 515. In one embodiment, the top portion 512 of the gate electrode region 510 is expanded laterally at least 20%. In other words, the width 517 is at least 120% of the width 516.

Figure 9B:
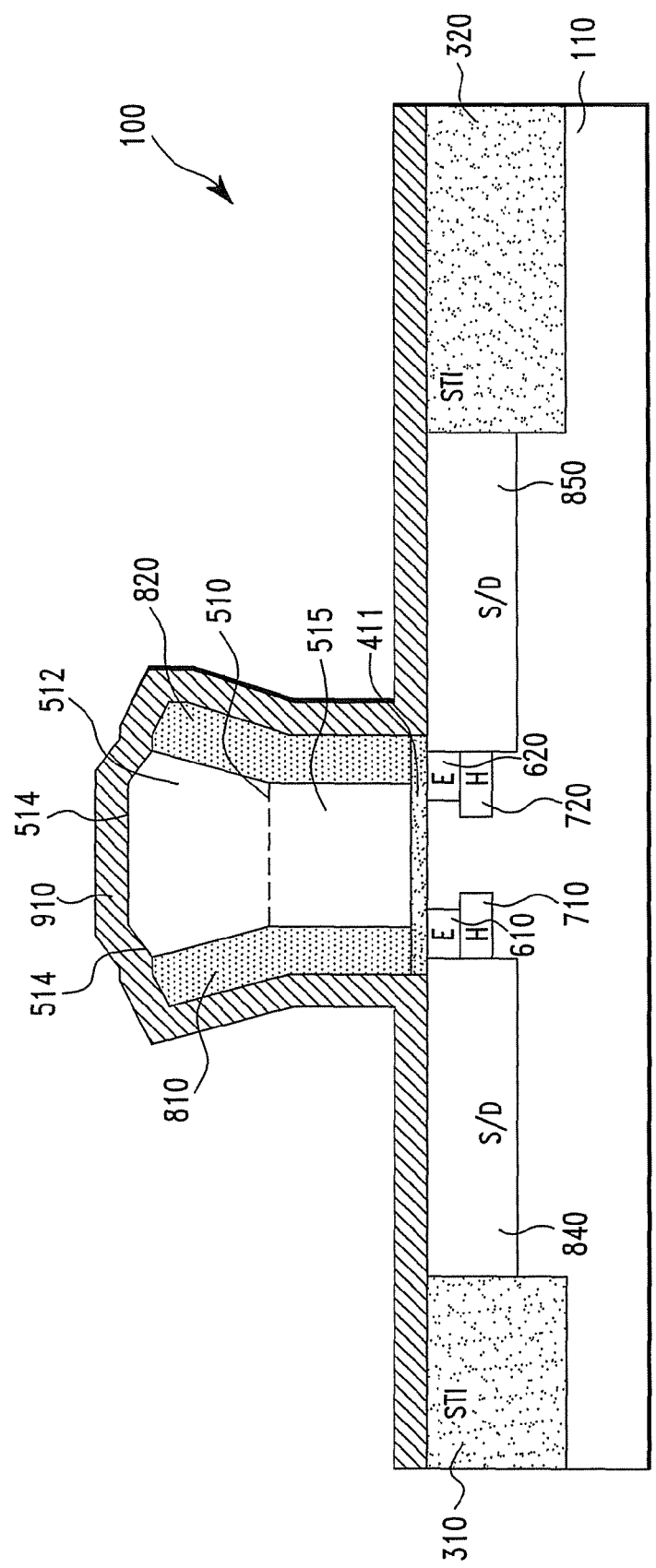

Next, with reference to FIG. 9B, in one embodiment, a metal (e.g., nickel, etc.) layer 910 is formed on top of the structure 100 of FIG. 9A. Illustratively, the nickel layer 910 is formed by sputtering of nickel everywhere on top of the structure 100 of FIG. 9A.

Figure 10:
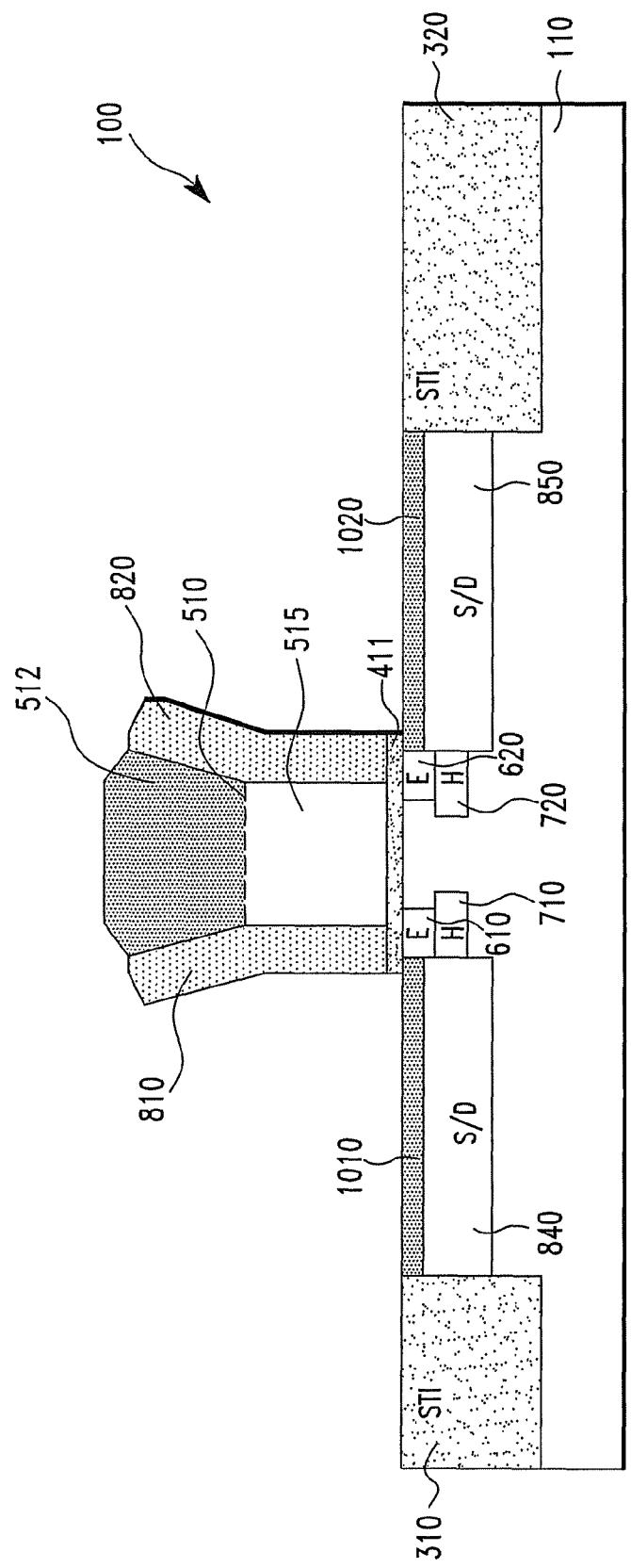

Next, with reference to FIG. 10, in one embodiment, silicide regions 512, 1010, and 1020 are formed on top of the gate electrode region 510, the source/drain regions 840 and 850, respectively. Illustratively, the silicide regions 512, 1010 and 1020 comprise nickel silicide. In one embodiment, the silicide regions 512, 1010 and 1020 are formed by first annealing the whole structure 100 of FIG. 9B so that nickel of the nickel layer 910 chemically reacts with silicon of the gate electrode region 510, the source/drain regions 840 and 850, resulting in the silicide regions 512, 1010 and 1020. Then, in one embodiment, unreacted nickel is removed by a wet etching step, resulting in structure 100 of FIG. 10. In one embodiment, the entire top portion 512 (FIG. 9B) of the gate electrode region 510 chemically reacts with Ni of the Ni layer 910 resulting in the silicide region 512 as sown in FIG. 10.

As can be seen in FIGS. 8, 9B, and 10, because of the germanium implantation step 830 (FIG. 8), an interfacing surface 514 between the nickel layer 910 and the top portion 512 of the gate electrode region 510 (FIG. 9B) is larger than the case in which the implantation step 830 is not performed. Therefore, it is easier for nickel (of the nickel layer 910) to react with silicon of the top portion 512 (FIG. 9B) than in the case the top portion of the gate electrode region 510 is not expanded. Also as a result of the top portion 512 being expanded laterally, the silicide region 512 (FIG. 10) is more conductive than the case in which the top portion 512 of the gate electrode region 510 is not expanded.

FIGS. 11-20 show a second fabrication process for forming a transistor structure 200, in accordance with embodiments of the present invention.

More specifically, with reference to FIG. 11, in one embodiment, the second fabrication process starts out with an SOI (Silicon on Insulator) substrate 1110. Illustratively, the SOI substrate 1110 comprises a silicon layer 1120, a buried oxide layer 1130 on the silicon layer 1120, and a silicon layer 1140 on the buried oxide layer 1130. Illustratively, the SOI substrate 1110 is formed by a conventional method. In one embodiment, the SOI substrate 1110 may comprise an Ultra-Thin SOI wherein the silicon layer 1140 is less than 15 nm in thickness.

Next, in one embodiment, a dielectric hard mask layer 1150 is formed on top of the silicon layer 1140. Illustratively, the dielectric hard mask layer 1150 is formed by CVD of silicon nitride or silicon dioxide, or a composite of the two, everywhere on top of the silicon layer 1140.

Next, in one embodiment, a lithographic and etching step is performed to etch the dielectric hard mask layer 1150 and then the silicon layer 1140 so as to form a dielectric cap region 1151 and a fin region 1141, respectively, as shown in FIG. 12.

With reference to FIG. 12 (a front view of the structure 200), it should be noted that the dielectric cap region 1151 and the fin region 1141 are farther away from the viewer than the silicon layer 1120 and the buried oxide layer 1130.

Figure 13A:
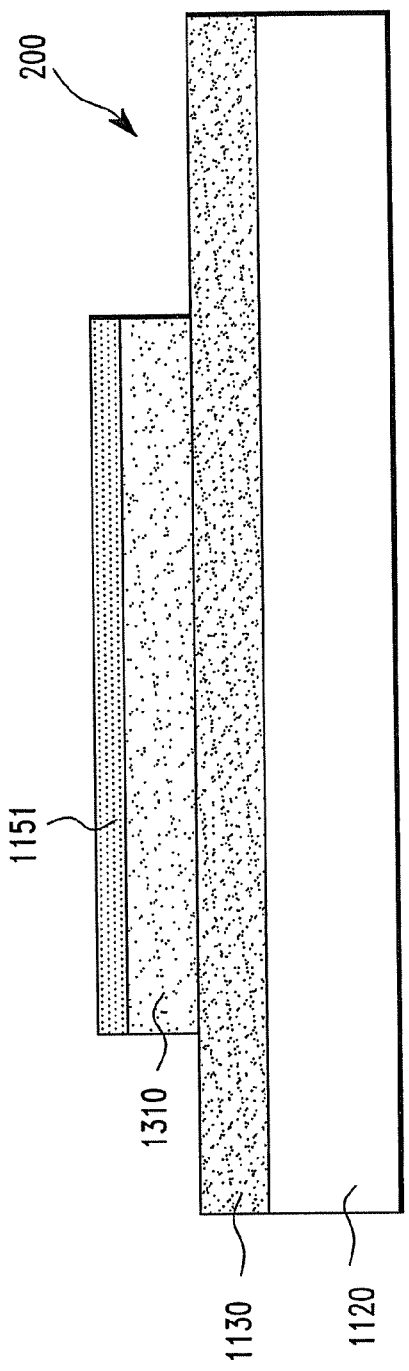

Next, with reference to FIG. 13A, in one embodiment, a silicon dioxide layer 1310 is formed on side walls of the fin region 1141 of FIG. 12. Illustratively, the silicon dioxide layer 1310 is formed by thermal oxidation. FIG. 13A shows a front view of the structure 200 after the silicon dioxide layer 1310 is formed. In alternative embodiments, 1310 may comprise a high-k gate dielectric, such as hafnium silicate, deposited, for example, by means of CVD, MOCVD, ALD.

Figure 13B:
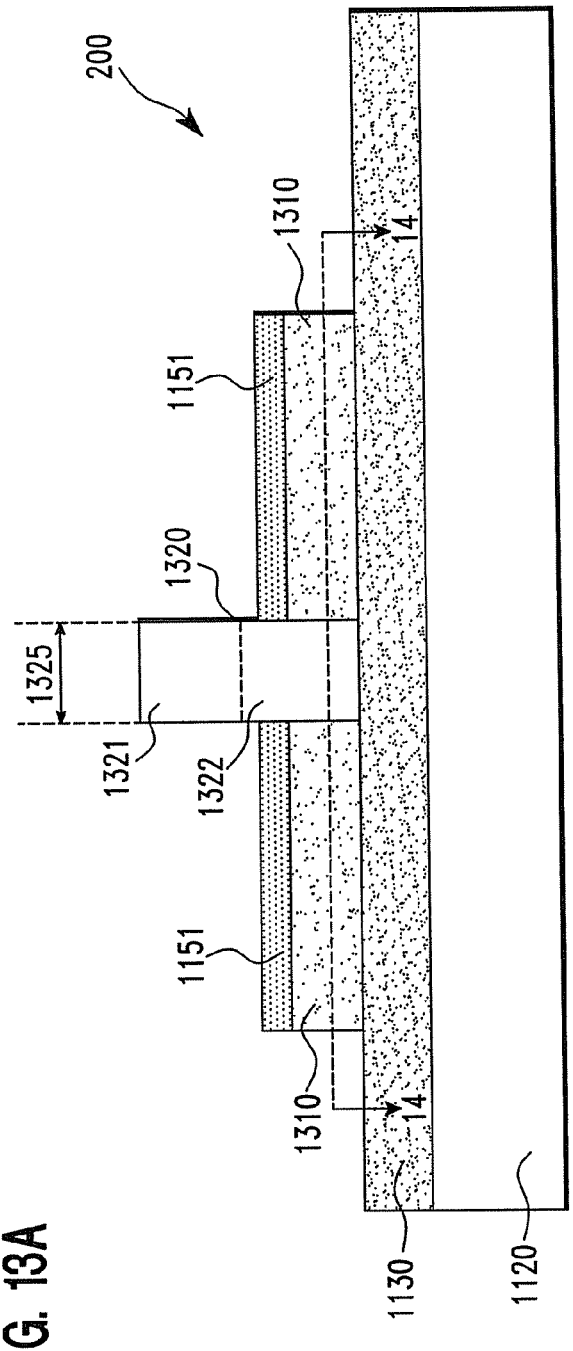

Next, with reference to FIG. 13B, in one embodiment, a gate electrode region 1320 is formed on top of the dielectric cap region 1151 and on side walls of the silicon dioxide layer 1310. Illustratively, the gate electrode region 1320 comprises polysilicon. In one embodiment, the gate electrode region 1320 is formed by (i) CVD of polysilicon everywhere on top of the structure 200 of FIG. 13A, and then (ii) a conventional lithographic and etching process. FIG. 13B shows a front view of the structure 200 after the gate electrode region 1320 is formed. So, it should be noted that the silicon dioxide layer 1310 and the dielectric cap region 1151 are farther away from the viewer than the gate electrode region 1320.

Next, in one embodiment, extension regions 1410 and 1420 and halo regions 1430 and 1440 (not shown in FIG. 13B but can be seen in FIG. 14) are formed in the fin region 1141 of FIG. 12 by ion implantation using the gate electrode region 1320 as a blocking mask.

FIG. 14 shows a top down view of the structure 200 of FIG. 13B along a line 14-14 after the formation of the extension regions 1410 and 1420 and halo regions 1430 and 1440.

Next, in one embodiment, germanium atoms are implanted on a top portion 1321 (FIG. 13B) of the gate electrode region 1320 by ion implantation. Illustratively, germanium atoms are implanted at a high dose ($10^{16}$ Ge atoms/cm$^2$) and at a low energy. As a result of the germanium implantation in the top portion 1321 (FIG. 13B) of the gate electrode 1320, the top portion 1321 expands laterally as shown in FIG. 15.

With reference to FIG. 15, it can be seen that as a result of the lateral expansion of the top portion 1321, a width 1326 of the top portion 1321 is greater than a width 1325 of a bottom portion 1322. In one embodiment, the top portion 1321 of the gate electrode region 1320 is expanded laterally at least 20%. In other words, the width 1326 is at least 120% of the width 1325.

Figure 16:
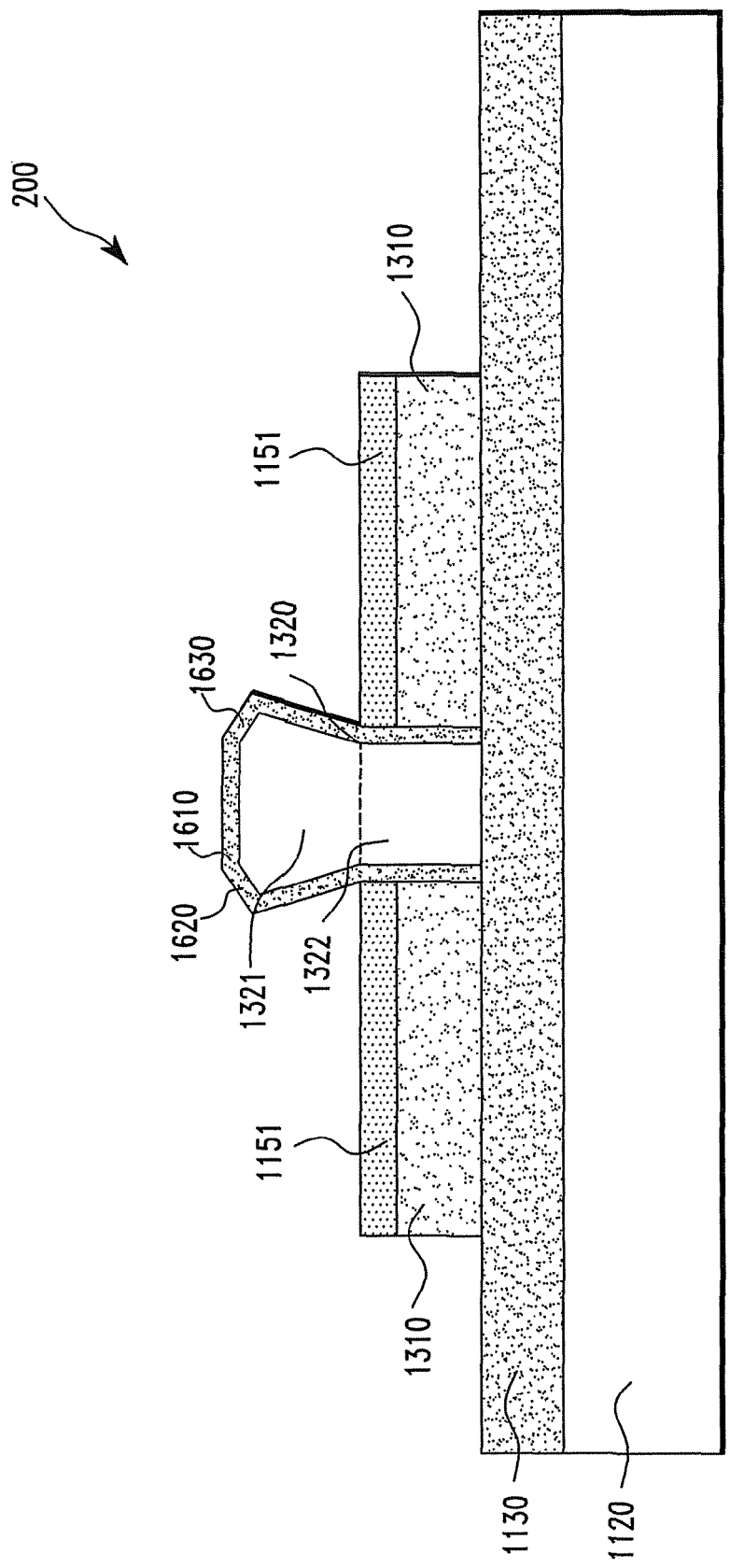

Next, with reference to FIG. 16, in one embodiment, a silicon dioxide layer 1610 is formed on top and side walls of the gate electrode region 1320. Illustratively, the silicon dioxide layer 1610 is formed by thermal oxidation. Hereafter, expanded top portions 1620 and 1630 of the gate electrode region 1320 are referred to as overhangs 1620 and 1630. FIG. 16 shows a front view of the structure 200 after the silicon dioxide layer 1610 is formed (except for the silicon dioxide layer 1610 and the gate electrode region 1320 whose cross section view is shown). It should be noted that, the silicon dioxide layer 1310 and the dielectric cap region 1151 are farther away from the viewer than the silicon dioxide layer 1610 and the gate electrode region 1320.

Figure 17:
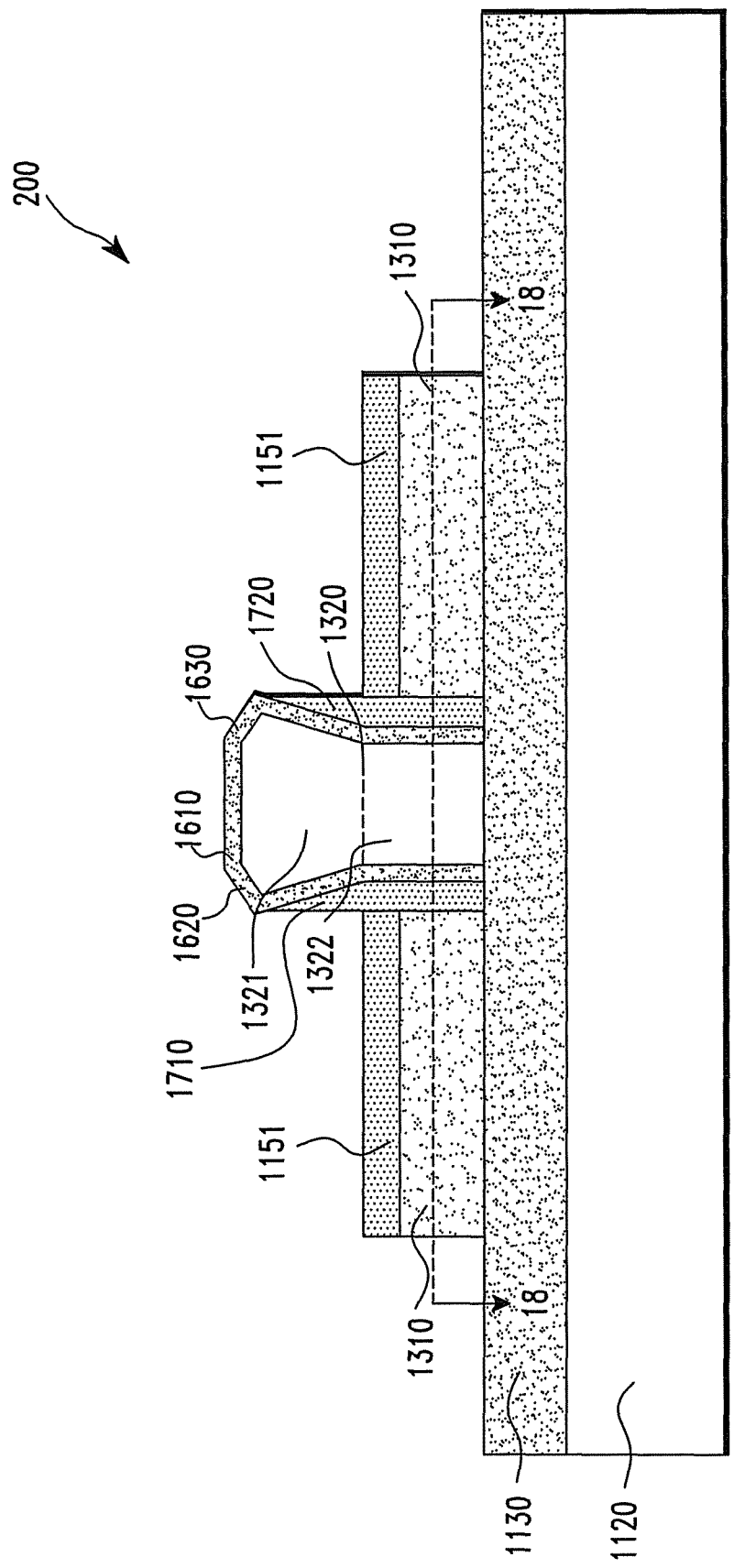

Next, with reference to FIG. 17, in one embodiment, dielectric spacers 1710 and 1720 are formed on side walls of the gate electrode region 1320 and under the overhangs 1620 and 1630. Illustratively, the dielectric spacers 1710 and 1720 are formed by (i) CVD of a dielectric material, such as silicon dioxide, silicon nitride, or a composite of the two, everywhere on top of the structure 200 of FIG. 16 to form a dielectric layer (not shown), and then (ii) directionally etching back the deposited dielectric layer. More specifically, the deposited dielectric layer is over etched so that the dielectric spacers 1710 and 1720 remain on side walls of the gate electrode region 1320 but no dielectric material remains on side walls of the silicon dioxide layer 1310. FIG. 17 shows a front view of the structure 200 after the dielectric spacers 1710 and 1720 are formed (except for the silicon dioxide layer 1610, the gate electrode region 1320 and the dielectric spacers 1710 and 1720 whose cross section view is shown).

Next, in one embodiment, source/drain regions 1810 and 1820 (not shown in FIG. 17 but can be seen in FIG. 18) are formed in the fin region 1141 of FIG. 18 by ion implantation using the gate electrode region 1320 and the dielectric spacers 1710 and 1720 as a blocking mask.

FIG. 18 shows a top down view of the structure 200 of FIG. 17 along a line 18-18 after the formation of the source/drain regions 1810 and 1820.

Next, with reference to FIG. 19, in one embodiment, the dielectric cap region 1151 of FIG. 17 is removed by a Reactive Ion Etch (RIE), or a wet etching step, resulting in the structure 200 of FIG. 19.

Figure 20:
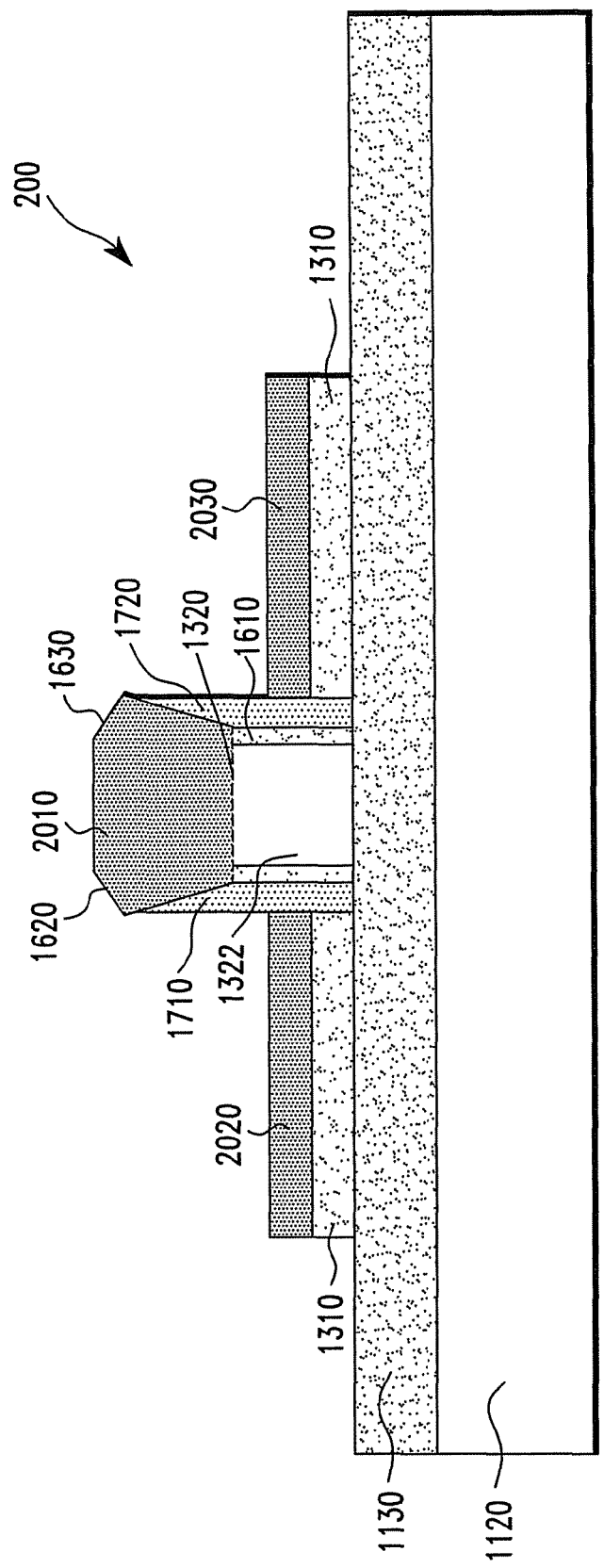

Next, with reference to FIG. 20, in one embodiment, silicide regions 2010, 2020, and 2030 are formed on top of the gate electrode region 1320 and the source/drain regions 1810 and 1820 (FIG. 18). Illustratively, the silicide regions 2010, 2020, and 2030 comprise silicide nickel. In one embodiment, the silicide regions 2010, 2020 and 2030 are formed by (i) sputtering of nickel everywhere on top of the structure 200 (FIG. 19) to form a nickel layer (not shown), then (ii) annealing so that nickel of the deposited nickel layer chemically reacts with silicon of the gate electrode region 1320 and the source/drain regions 1810 and 1820 (FIG. 18) resulting in the silicide regions 2010, 2020, and 2030. Then, unreacted nickel is removed by a wet etching step, resulting in structure 200 of FIG. 20.

Similar to the structure 100 of FIG. 10, the structure 200 of FIG. 20 has an advantage of the enlarged silicide region 2010 which is more conductive than in the case in which the top portion 1321 of the gate electrode 1320 is not expanded laterally by the germanium implantation. Moreover, because the top portion 1321 of the gate electrode 1320 (FIG. 19) is enlarged, it is easier for nickel of the deposited nickel layer (not shown) to chemically react with silicon of the gate electrode region 1320 to form the silicide 2010.

FIGS. 21-30 show a third fabrication process for forming a transistor structure 300, in accordance with embodiments of the present invention, wherein FIGS. 21-30 show cross-section views of the transistor structure 300.

More specifically, with reference to FIG. 21, in one embodiment, the third fabrication process starts out with an SOI substrate 2110. In one embodiment, the SOI substrate 2110 comprises a silicon layer 2120, a buried oxide layer 2130 on the silicon layer 2120, and a silicon layer 2140 on the buried oxide layer 2130. Illustratively, the SOI substrate 2110 is formed by a conventional method.

Next, with reference to FIG. 22, in one embodiment, a trench 2210 is formed in the silicon layer 2140. In one embodiment, the trench 2210 is formed by a conventional lithographic and etching process.

Figure 23:
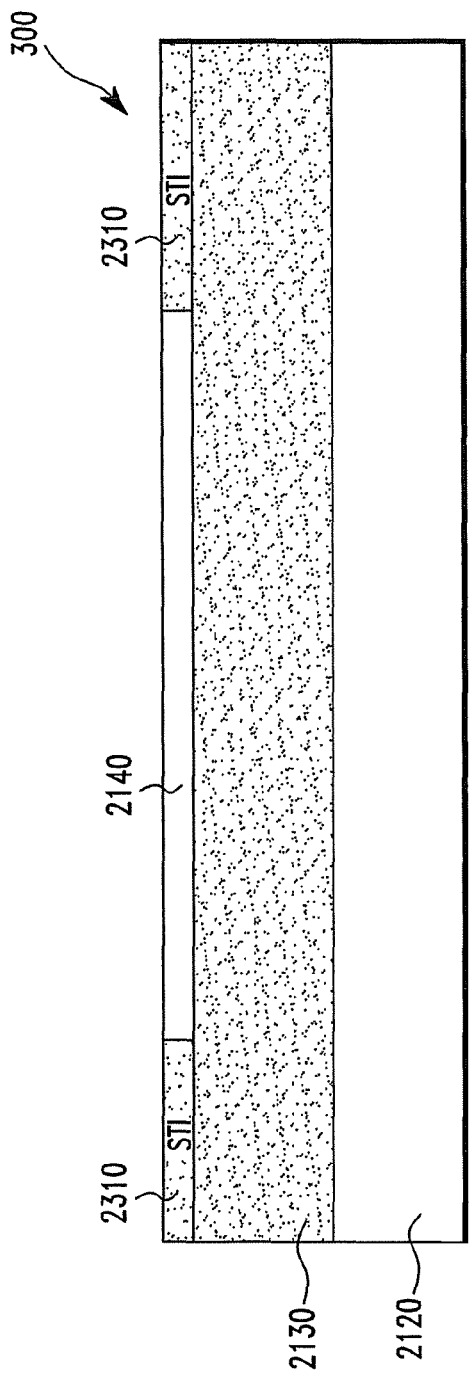

Next, with reference to FIG. 23, in one embodiment, an STI region 2310 is formed in the trench 2210 (FIG. 22) using a conventional method. Illustratively, the STI region 2310 comprises silicon dioxide.

Figure 24:
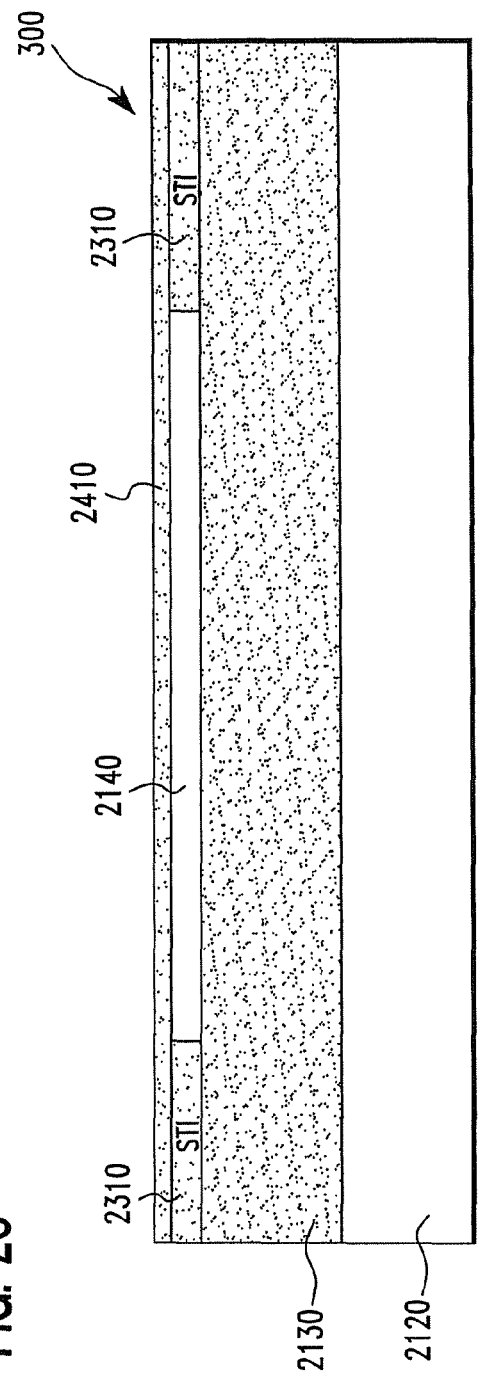

Next, with reference to FIG. 24, in one embodiment, a gate dielectric layer 2410 is formed on top of the structure 300 (FIG. 23). The gate dielectric layer 2410 may be formed (a) by oxidation and nitridation of a top portion of the silicon layer 2140, to form a silicon oxinitride dielectric, or (b) by deposition of a high-k material such as hafnium silicate by CVD, MOCVD, or ALD.

Figure 25:
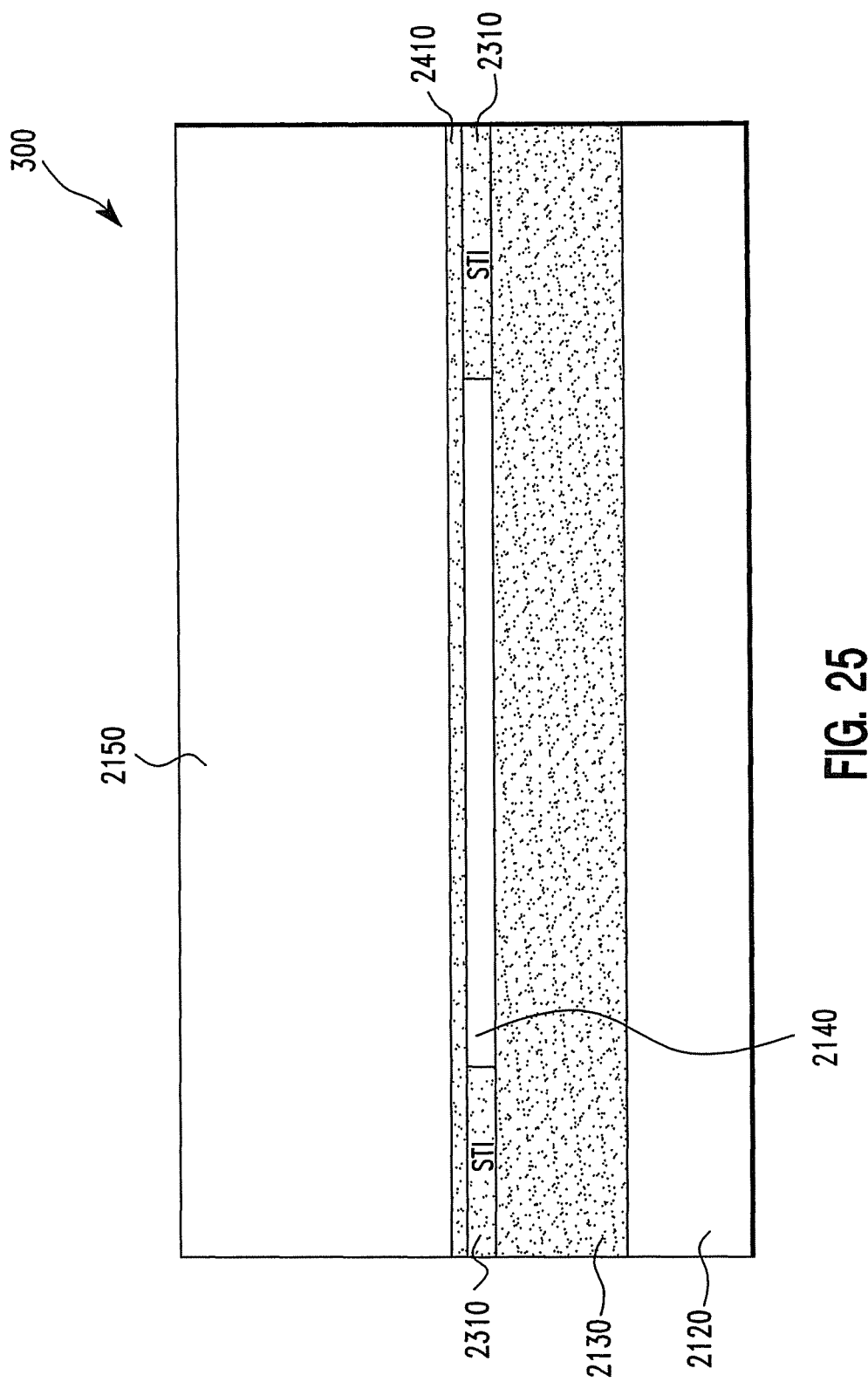

Next, with reference to FIG. 25, in one embodiment, a polysilicon layer 2510 is formed on top of the structure 300 (FIG. 24) by CVD.

Figure 26:
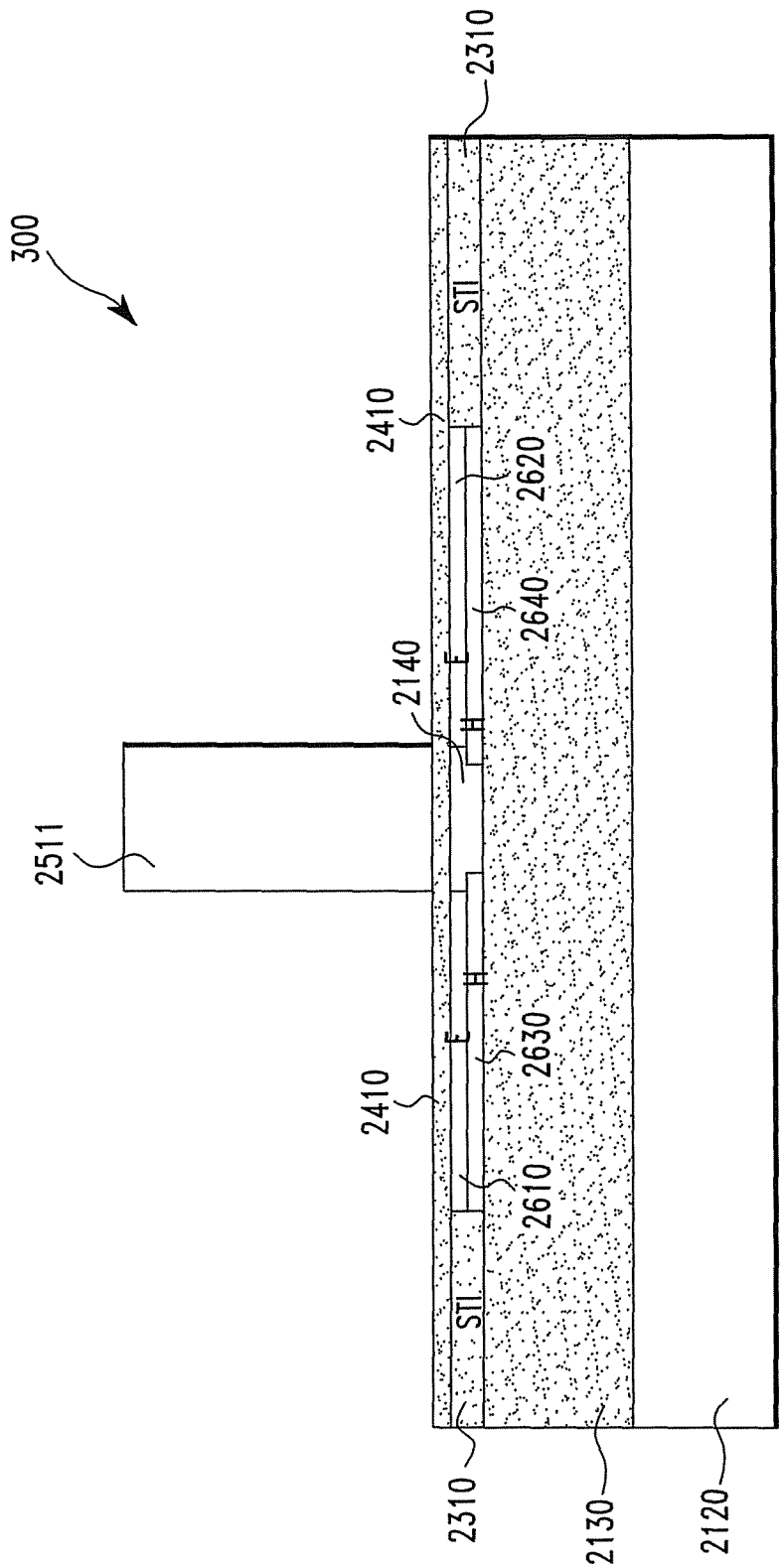

Next, in one embodiment, the polysilicon layer 2510 is selectively etched, resulting in a gate electrode region 2511 as shown in FIG. 26.

Next, with reference to FIG. 26, in one embodiment, extension regions 2610 and 2620 and halo regions 2630 and 2640 are formed in the silicon layer 2140. Illustratively, the extension regions 2610 and 2620 and halo regions 2630 and 2640 are formed by ion implantation using the gate electrode region 2511 as a blocking mask. Hereafter, a silicon region of the silicon layer 2140 which is disposed between the extension regions 2610 and 2620 and the halo regions 2630 and 2640 is referred to as a channel region 2140.

Figure 27:
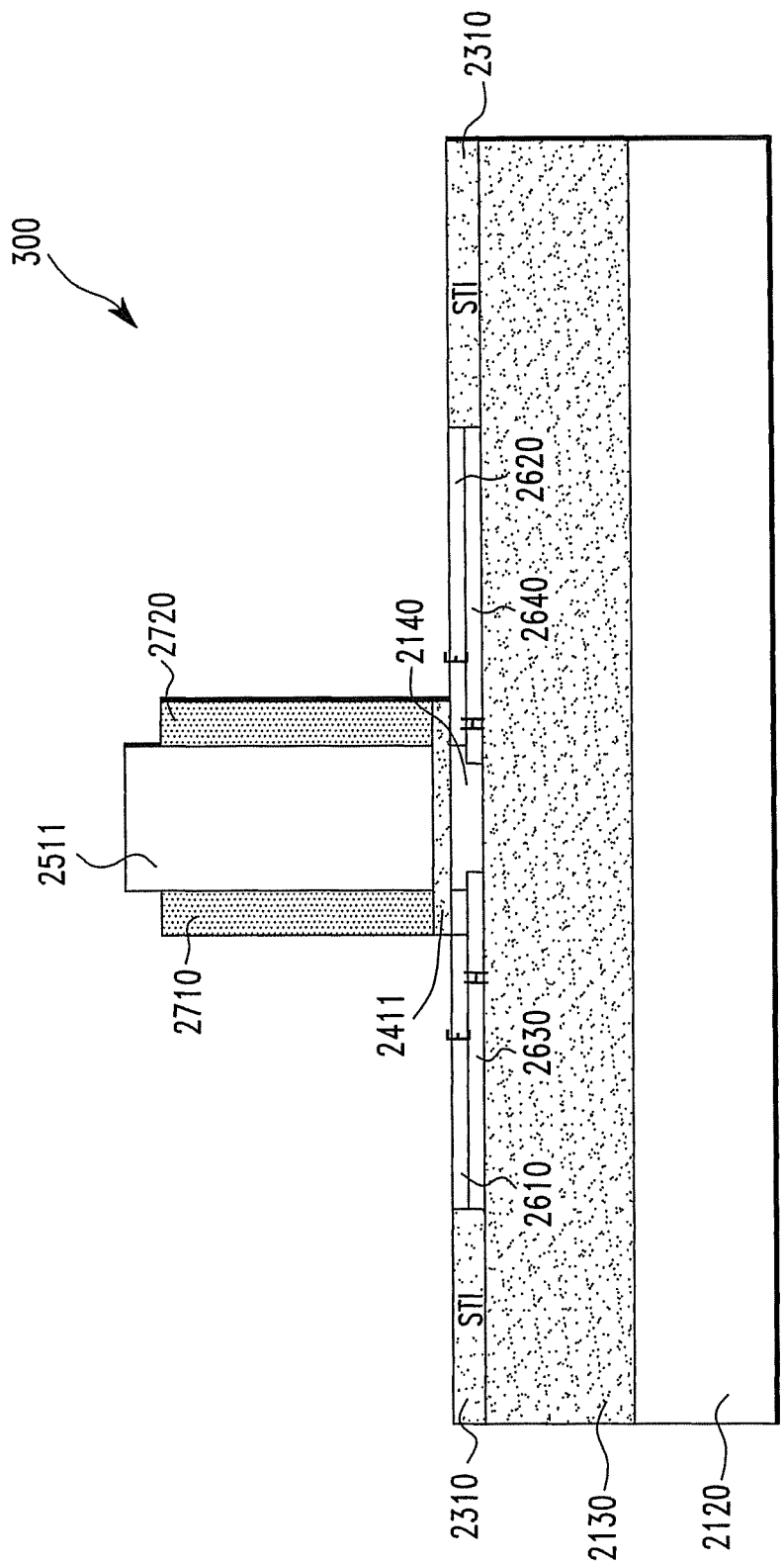

Next, with reference to FIG. 27, in one embodiment, dielectric spacers 2710 and 2720 are formed on side walls of the gate electrode region 2511. Illustratively, the dielectric spacers 2710 and 2720 are formed by (i) CVD of a dielectric layer, such as silicon dioxide or silicon nitride, or a composite of both, everywhere on top of the structure 300 of FIG. 26, and then (ii) directional etching back. Any remaining gate dielectric layer 2410 in the etched-back regions is completely removed by either sufficient over etch, or by and additional etching process, resulting in a gate dielectric region 2411.

Figure 28A:
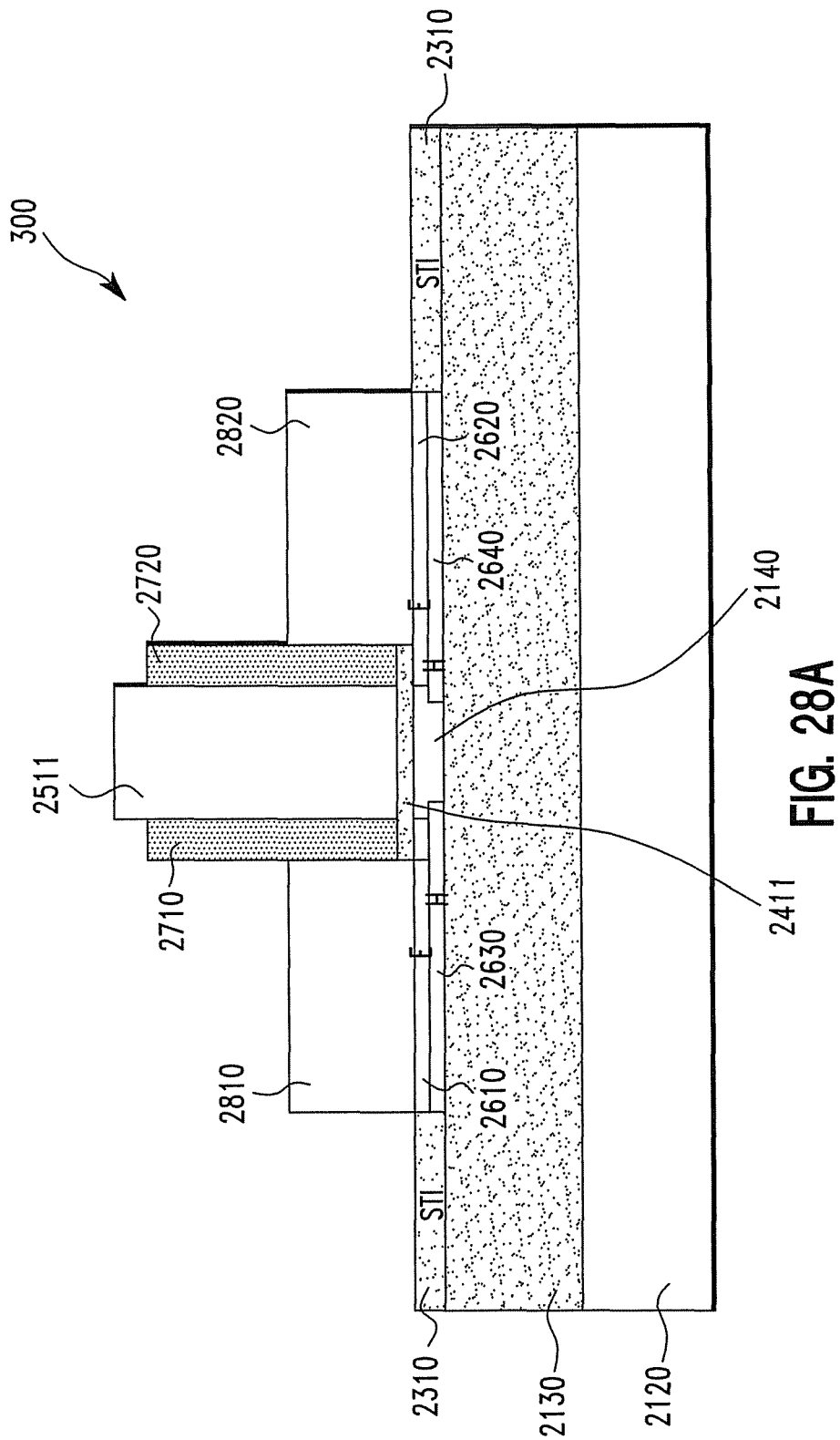

Next, with reference to FIG. 28A, in one embodiment, silicon regions 2810 and 2820 are epitaxially grown on the extension regions 2610 and 2620, respectively.

It should be noted that the silicon is also epitaxially grown on top of the gate electrode region 2511. But to make the description simple, this is not shown. Alternatively, in one embodiment, before the formation of the silicon regions 2810 and 2820 by epitaxial growth, a cap region (not shown) can be formed on top of the gate electrode region 2511. In one embodiment, the cap region (not shown) comprises a silicon dioxide layer and a silicon nitride layer (not shown). More specifically, the silicon dioxide layer and the silicon nitride layer (not shown) can be formed in that order on top of the polysilicon layer 2510 of FIG. 25. After that, the silicon dioxide layer and the silicon nitride layer (not shown) can be patterned at the same time that the gate electrode region 2511 is formed. As a result, portions of the silicon dioxide layer and the silicon nitride layer (not shown) still remain on top of the gate electrode region 2511. Therefore, the cap region (not shown) can prevent epitaxial growth of the silicon on top of the gate electrode region 2511.

Next, in one embodiment, the gate electrode region 2511 and the dielectric spacers 2710 and 2720 are used as a blocking mask to ion implant the silicon regions 2810 and 2820, the extension regions 2610 and 2620 and the halo regions 2630 and 2640 so as to form source/drain regions 2811 and 2821 (as shown in FIG. 28B).

Next, in one embodiment, with reference to FIG. 28B, germanium atoms are implanted in a top portion 2512 of the gate electrode region 2511 by ion implantation in a direction indicated by arrows 2830. Hereafter, the implantation of germanium atoms in the top portion 2512 of the gate electrode region 2511 can be referred to as a germanium implantation step 2830. Illustratively, the germanium implantation step 2830 uses germanium atoms at a high dose ($10^{16}$ Ge atoms/$cm^2$) and at a low energy. As a result of the germanium implantation step 2830, the top portion 2512 expands laterally, as shown in FIG. 29.

Figure 29:
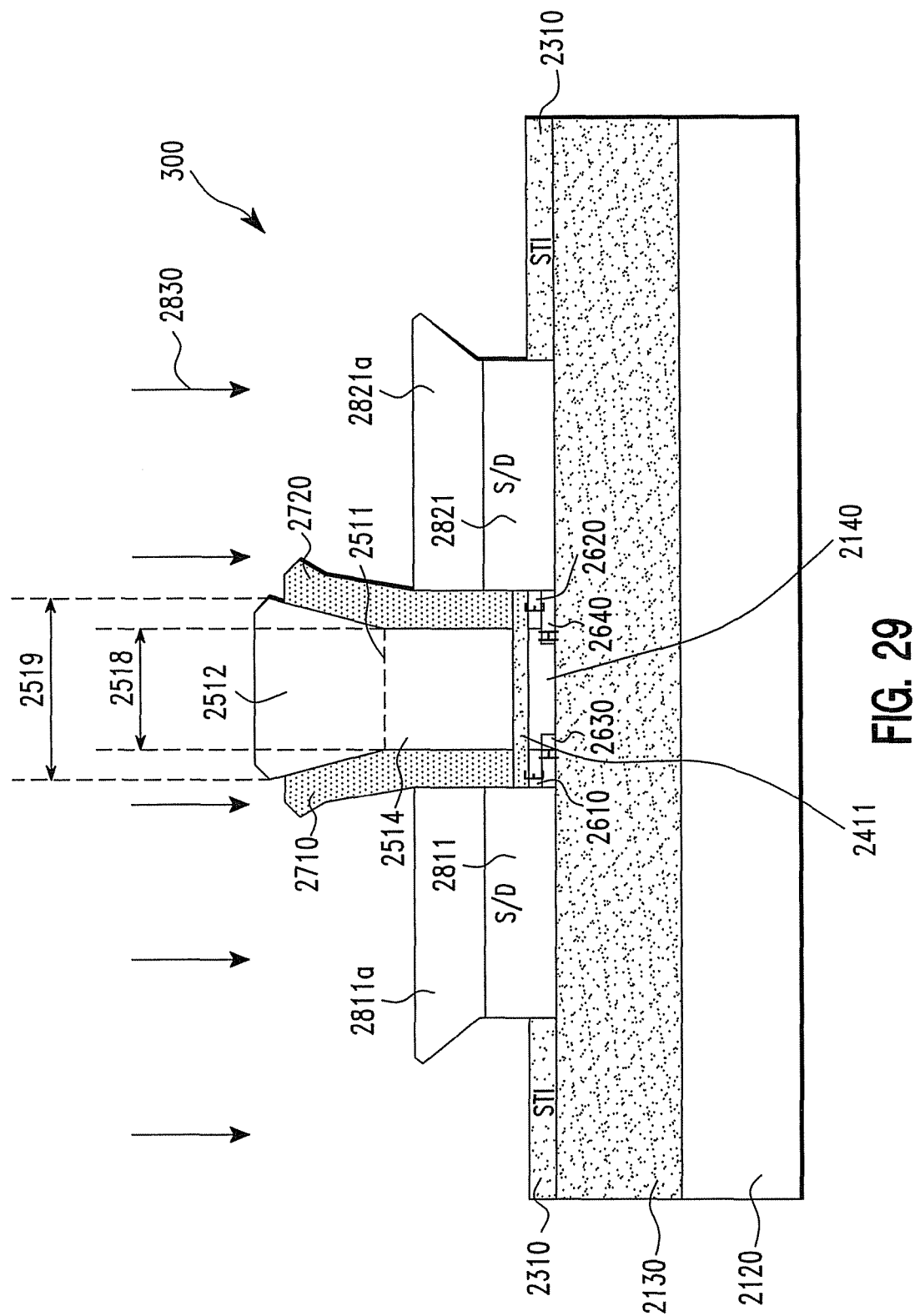

With reference to FIG. 29, it can be seen that as a result of the lateral expansion of the top portion 2512, a width 2519 of the top portion 2512 is greater than a width 2518 of a bottom portion 2514. In one embodiment, the top portion 2512 of the gate electrode region 2511 is expanded laterally at least 20%. In other words, the width 2519 is at least 120% of the width 2518. In one embodiment, the germanium implantation step 2830 also implants Germanium atoms in upper portions 2811a and 2821a of the source/drain regions 2811 and 2821, respectively. As a result, the upper portions 2811a and 2821a are expanded laterally and compressively strained. Therefore, the channel region 2140 is tensile strained.

Figure 30:
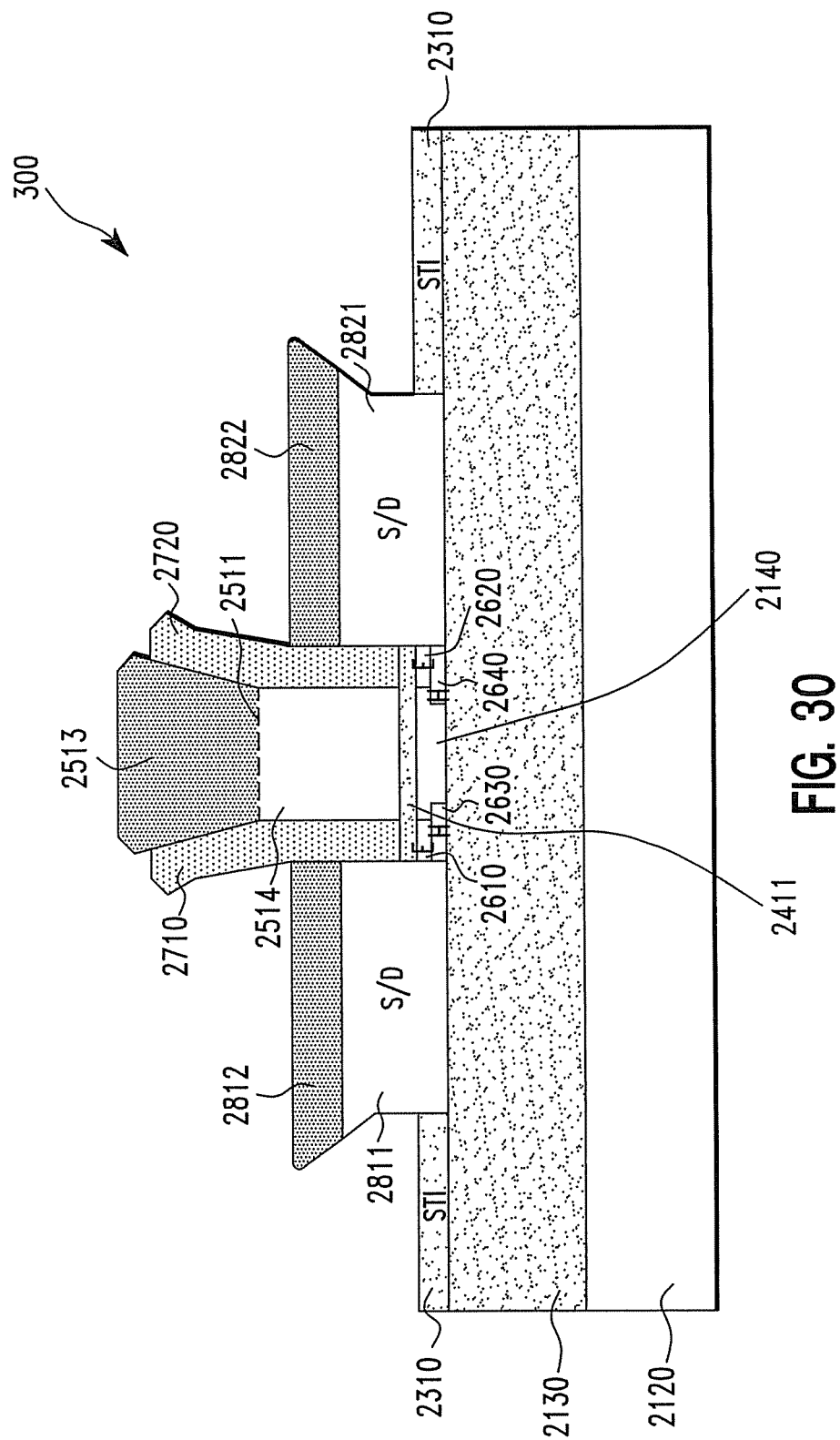

Next, with reference to FIG. 30, in one embodiment, silicide regions 2513, 2812 and 2822 are formed on top of the gate electrode region 2511, the source/drain regions 2811 and 2821, respectively. Illustratively, the silicide regions 2513, 2812, and 2822 comprise silicide nickel. In one embodiment, the silicide regions 2513, 2811 and 2821 are formed by (i) CVD of nickel everywhere on top of the structure 300 (FIG. 29) to form a nickel layer (not shown), then (ii) annealing so that the deposited nickel layer chemically reacts with silicon on top portions of the gate electrode region 2511, the source/drain regions 2811 and 2821 so as to form the silicide regions 2513, 2812 and 2822. Then, unreacted nickel is removed by a wet etching step, resulting in structure 300 of FIG. 30.

In the embodiments described above, germanium ions/atoms are implanted in the gates so as to expand the top portions of the gates. Alternatively, arsenic can be used instead of germanium. Also, in one embodiment, the germanium and arsenic ion implantations can be carried out at room temperature with the ions being at an energy of 25 KeV such that the ions can reach as deep as 23 nm in the gates.

In one embodiment, as a result of the Ge implantation in the top portion 512 (FIG. 9A), the top portion 1321 (FIG. 13B), the top portion 2512 (FIG. 29), and in the top portions 2811a and 2821a (FIG. 29), each of these portions 512, 1321, 2512, 2811a, and 2821a is at least 0.5% compressively strained, meaning the average atom spacing of the resulting Si—Ge lattice is 0.5% less than the average atom spacing of a Si—Ge mixture of the same composition ratio in a relaxed/unstrained condition.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A structure fabrication method, said method comprising:
providing a structure which comprises a substrate, a gate dielectric region on and in direct physical contact with the substrate, and a gate electrode region on and in direct physical contact with a top surface of the gate dielectric region, wherein the top surface of the gate dielectric region defines a reference direction perpendicular to the top surface of the gate dielectric region;
implanting atoms in a top portion of the gate electrode region, which expands the top portion of the gate electrode region in a lateral direction parallel to the top surface of the gate dielectric region;
after said implanting atoms, forming a conformal dielectric layer on top and side walls of the gate electrode region;
forming a dielectric spacer layer on the conformal dielectric layer; and
etching the dielectric spacer layer such that only spacer portions of the dielectric spacer layer which are under the conformal dielectric layer remain, wherein for any point of the remaining spacer portions, a straight line through that point and parallel to the reference direction intersects the conformal dielectric layer.

2. The method of claim 1,
wherein a lateral direction is perpendicular to the reference direction and parallel to the top surface of the gate dielectric region,
wherein a bottom portion of the gate electrode region is disposed between the top portion of the gate electrode region and the gate dielectric region,
wherein a width in the lateral direction of the top portion of the gate electrode region is equal to a width in the lateral direction of a bottom portion of the gate electrode region before said implanting is performed, and
wherein the width in the lateral direction of the top portion of the gate electrode region is at least 20% greater than the width in the lateral direction of the bottom portion of the gate electrode region after said implanting is performed.

3. The method of claim 1, wherein the substrate comprises a channel region, a first source/drain region, and a second source/drain region, and wherein the channel region is disposed between the first source/drain region and the second source/drain region.

4. The method of claim 3,
said method further comprising implanting other atoms in the first and second source/drain regions to expand first and second upper portions of the first and second source/drain regions, respectively,
wherein the other atoms are different atoms than the atoms implanted in the top portion of the gate electrode region, and
wherein said implanting the atoms and said implanting the other atoms are performed simultaneously.

5. The method of claim 3, said method further comprising:
after said implanting the atoms is performed, forming silicide regions in the top portion of the gate electrode region and on the first source/drain region and the second source/drain region.

6. The method of claim 3, wherein the top portion of the gate electrode region and the first and second source/drain regions each comprise silicon, and wherein said forming the silicide regions comprises:
depositing nickel on top of the structure; and
annealing the structure so that the nickel chemically reacts with the silicon of the top portion of the gate electrode region and the first and second source/drain regions to form the silicide regions.

7. The method of claim 3,
wherein the structure further comprises a first extension region, a second extension region, a first halo region, and a second halo region,
wherein the first extension region is in direct physical contact with the channel region and the first source/drain region,
wherein the second extension region is in direct physical contact with the channel region and the second source/drain region,
wherein the first halo region is in direct physical contacts with the channel region, the first source/drain region and the first extension region, and
wherein the second halo region is in direct physical contacts with the channel region, the second source/drain region and the second extension region.

8. The method of claim 7, wherein the first and second source/drain regions, the first and second extension regions, and the first and second halo regions are formed by ion implantation.

9. The method of claim 1, wherein the top portion of the gate electrode region comprises germanium and polysilicon after said implanting is performed.

10. The method of claim 1, wherein said implanting atoms is performed at an energy of about 25 KeV.

11. The method of claim 1, wherein said implanting atoms is performed at about room temperature.

12. The method of claim 1, wherein said implanting atoms is performed in a direction making with the reference direction an angle less than 10 degrees.

13. The method of claim 1, wherein the atoms are germanium atoms.

14. The method of claim 13, wherein said implanting atoms is performed at a dose of $10^{16}$ germanium atoms/cm$^2$.

* * * * *